US008443263B2

(12) United States Patent
Selinger et al.

(10) Patent No.: US 8,443,263 B2
(45) Date of Patent: May 14, 2013

(54) METHOD AND CONTROLLER FOR PERFORMING A COPY-BACK OPERATION

(75) Inventors: Robert D. Selinger, San Jose, CA (US); Gary Lin, San Jose, CA (US); Paul Lassa, Cupertino, CA (US); Chaoyang Wang, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 590 days.

(21) Appl. No.: 12/650,263

(22) Filed: Dec. 30, 2009

(65) Prior Publication Data
US 2011/0161784 A1 Jun. 30, 2011

(51) Int. Cl.
*G06F 11/00* (2006.01)
(52) U.S. Cl.
USPC .......................................... 714/768
(58) Field of Classification Search .................. None
See application file for complete search history.

(56) References Cited

U.S. PATENT DOCUMENTS

| 5,404,485 | A | 4/1995 | Ban |
| 5,434,825 | A | 7/1995 | Harari |
| 5,532,962 | A | 7/1996 | Auclair et al. |
| 5,799,168 | A | 8/1998 | Ban |
| 5,818,757 | A | 10/1998 | So et al. |
| 5,937,425 | A | 8/1999 | Ban |
| 5,943,283 | A | 8/1999 | Wong et al. |
| 6,034,882 | A | 3/2000 | Johnson et al. |
| 6,119,245 | A | 9/2000 | Hiratsuka |
| 6,181,599 | B1 | 1/2001 | Gongwer |
| 6,185,122 | B1 | 2/2001 | Johnson et al. |
| 6,230,233 | B1 | 5/2001 | Lofgren et al. |
| 6,266,273 | B1 | 7/2001 | Conley et al. |
| 6,317,799 | B1 | 11/2001 | Futral et al. |
| 6,420,215 | B1 | 7/2002 | Knall et al. |

(Continued)

FOREIGN PATENT DOCUMENTS

| EP | 1 146 428 | 10/2001 |
| WO | WO 2005/066773 | 7/2005 |

(Continued)

OTHER PUBLICATIONS

"Notification of the First Office Action" (with translation) for Chinese patent application No. 200680035631.0, 14 pages, Jul. 13, 2010.

(Continued)

*Primary Examiner* — Christopher McCarthy
(74) *Attorney, Agent, or Firm* — Brinks Hofer Gilson & Lione

(57) ABSTRACT

The embodiments described herein provide a method and controller for performing a copy-back command. In one embodiment, a controller receives the data and error correction code associated with a copy-back operation from at least one flash memory device. The controller determines if the error correction code indicates there is an error in the data. If the error correction code does not indicate there is an error in the data, the controller sends a destination address and copy-back program command received from a host to the at least one flash memory device. If the error correction code indicates there is an error in the data, the controller corrects the data and sends the destination address, the corrected data, and a program command to the at least one flash memory device. Additional embodiments relate to modifying data during the copy-back operation.

25 Claims, 19 Drawing Sheets

U.S. PATENT DOCUMENTS

| | | | |
|---|---|---|---|
| 6,426,893 B1 | 7/2002 | Conley et al. | |
| 6,498,851 B1 | 12/2002 | Wong | |
| 6,591,330 B2 | 7/2003 | Lasser | |
| 6,594,183 B1 | 7/2003 | Lofgren et al. | |
| 6,624,773 B2 | 9/2003 | Wong | |
| 6,631,085 B2 | 10/2003 | Kleveland et al. | |
| 6,683,817 B2 | 1/2004 | Wei et al. | |
| 6,694,415 B2 | 2/2004 | March et al. | |
| 6,715,044 B2 | 3/2004 | Lofgren et al. | |
| 6,721,820 B2 | 4/2004 | Zilberman et al. | |
| 6,760,805 B2 | 7/2004 | Lasser | |
| 6,988,175 B2 | 1/2006 | Lasser | |
| 7,012,835 B2 | 3/2006 | Gonzalez et al. | |
| 7,081,377 B2 | 7/2006 | Cleeves | |
| 7,120,729 B2 | 10/2006 | Gonzalez et al. | |
| 7,136,973 B2 | 11/2006 | Sinclair | |
| 7,149,119 B2 | 12/2006 | Fasoli | |
| 7,170,788 B1 | 1/2007 | Wan et al. | |
| 7,171,536 B2 | 1/2007 | Chang et al. | |
| 7,177,191 B2 | 2/2007 | Fasoli | |
| 7,177,977 B2 | 2/2007 | Chen et al. | |
| 7,187,583 B2 | 3/2007 | Yang et al. | |
| 7,218,552 B1 | 5/2007 | Wan et al. | |
| 7,224,607 B2 | 5/2007 | Gonzalez et al. | |
| 7,234,049 B2 | 6/2007 | Choi et al. | |
| 7,239,556 B2 | 7/2007 | Abe et al. | |
| 7,262,994 B2 | 8/2007 | Fong et al. | |
| 7,295,473 B2 | 11/2007 | Fong et al. | |
| 7,345,907 B2 | 3/2008 | Scheuerlein | |
| 7,349,258 B2 | 3/2008 | Fong et al. | |
| 7,355,888 B2 | 4/2008 | Hemink et al. | |
| 7,355,889 B2 | 4/2008 | Hemink et al. | |
| 7,362,604 B2 | 4/2008 | Scheuerlein | |
| 7,366,029 B2 | 4/2008 | Kagan | |
| 7,379,330 B2 | 5/2008 | Conley et al. | |
| 7,379,334 B2 | 5/2008 | Murakami et al. | |
| 7,392,343 B2 | 6/2008 | Oshima | |
| 7,406,572 B1 | 7/2008 | Nguyen | |
| 7,426,137 B2 | 9/2008 | Hemink | |
| 7,433,241 B2 | 10/2008 | Dong et al. | |
| 7,436,713 B2 | 10/2008 | Hemink | |
| 7,440,318 B2 | 10/2008 | Fong et al. | |
| 7,440,323 B2 | 10/2008 | Lutze et al. | |
| 7,443,736 B2 | 10/2008 | Samachisa | |
| 7,447,065 B2 | 11/2008 | Fong et al. | |
| 7,447,066 B2 | 11/2008 | Conley et al. | |
| 7,450,430 B2 | 11/2008 | Hemink et al. | |
| 7,463,531 B2 | 12/2008 | Hemink et al. | |
| 7,464,259 B2 | 12/2008 | Sukegawa et al. | |
| 7,468,911 B2 | 12/2008 | Lutze et al. | |
| 7,468,918 B2 | 12/2008 | Dong et al. | |
| 7,475,184 B2 | 1/2009 | Lee | |
| 7,477,547 B2 | 1/2009 | Lin | |
| 7,495,956 B2 | 2/2009 | Fong et al. | |
| 7,499,326 B2 | 3/2009 | Hemink | |
| 7,890,732 B2 | 2/2011 | Sukegawa | |
| 7,941,586 B2 * | 5/2011 | Kim | 711/103 |
| 2001/0028523 A1 | 10/2001 | Moro et al. | |
| 2003/0028704 A1 | 2/2003 | Mukaida et al. | |
| 2003/0051118 A1 | 3/2003 | Wu et al. | |
| 2003/0065899 A1 | 4/2003 | Gorobets | |
| 2003/0079077 A1 | 4/2003 | Piau et al. | |
| 2003/0097520 A1 | 5/2003 | Lai et al. | |
| 2003/0099134 A1 | 5/2003 | Lasser et al. | |
| 2003/0135688 A1 | 7/2003 | Tai | |
| 2003/0206442 A1 | 11/2003 | Tang et al. | |
| 2003/0229645 A1 | 12/2003 | Mogi et al. | |
| 2004/0103234 A1 | 5/2004 | Zer et al. | |
| 2004/0205418 A1 * | 10/2004 | Sakaue et al. | 714/52 |
| 2005/0005055 A1 | 1/2005 | Pasotti et al. | |
| 2005/0050235 A1 | 3/2005 | Choi | |
| 2005/0055479 A1 | 3/2005 | Zer et al. | |
| 2005/0092846 A1 | 5/2005 | Lai et al. | |
| 2005/0125630 A1 * | 6/2005 | Liao et al. | 712/5 |
| 2005/0172065 A1 | 8/2005 | Keays | |
| 2005/0180209 A1 | 8/2005 | Lasser | |
| 2005/0207231 A1 | 9/2005 | Kim | |
| 2005/0237814 A1 | 10/2005 | Li et al. | |
| 2005/0286306 A1 | 12/2005 | Srinivasan et al. | |
| 2005/0289314 A1 * | 12/2005 | Adusumilli et al. | 711/168 |
| 2006/0184709 A1 | 8/2006 | Sukegawa et al. | |
| 2006/0239450 A1 | 10/2006 | Holtzman et al. | |
| 2007/0047306 A1 | 3/2007 | Roohparvar | |
| 2007/0074093 A1 | 3/2007 | Lasser et al. | |
| 2007/0088940 A1 | 4/2007 | Conley | |
| 2007/0101237 A1 | 5/2007 | Tamura et al. | |
| 2007/0170268 A1 | 7/2007 | Lee | |
| 2007/0263440 A1 | 11/2007 | Cornwell et al. | |
| 2007/0276987 A1 | 11/2007 | Luo et al. | |
| 2008/0046630 A1 | 2/2008 | Lasser | |
| 2008/0046641 A1 | 2/2008 | Lasser | |
| 2008/0151618 A1 | 6/2008 | Sharon et al. | |
| 2008/0158948 A1 | 7/2008 | Sharon et al. | |
| 2008/0222491 A1 | 9/2008 | Lee et al. | |
| 2008/0243954 A1 | 10/2008 | Augenstein et al. | |
| 2009/0031072 A1 | 1/2009 | Sartore | |
| 2009/0049229 A1 | 2/2009 | Honda et al. | |
| 2009/0132760 A1 | 5/2009 | Flynn et al. | |
| 2010/0023676 A1 * | 1/2010 | Moon et al. | 711/103 |
| 2010/0031270 A1 | 2/2010 | Wu et al. | |
| 2010/0082882 A1 * | 4/2010 | Im et al. | 711/103 |
| 2011/0131383 A1 * | 6/2011 | Kim et al. | 711/148 |

FOREIGN PATENT DOCUMENTS

| | | |
|---|---|---|
| WO | WO 2009/032945 | 3/2009 |
| WO | WO 2009/088920 | 7/2009 |
| WO | WO 2009/134576 | 11/2009 |

OTHER PUBLICATIONS

Cooke, J., Microsoft WinHec 2007, "Flash Memory Technology Direction", Apr. 30, 2007, pp. 1-11.

Cooke, J., Powerpoint Presentation, Flash Memory Summit, "NAND 101, An Introduction to NAND Flash and How to Design It in to Your Next Product", Aug. 8, 2006, pp. 1-68.

Denali Software, "Spectra™ NAND Flash File System", http://www.denali.com/en/products/spectra_ffs.jsp, copyright 1994-2009, retrieved on Aug. 6, 2009, pp. 1-3.

EE Times Asia, "Toshiba Mixes LBA to NAND Flash Memory", http://www.eetasia.com/ARTP_8800428816_499486.htm, posted on Aug. 9, 2006, 1 page.

Inoue, A. et al., "NAND Flash Applications Design Guide, System Solutions from Toshiba America Electronic Components, Inc.", Revision 1.0, Apr. 2003, pp. 1-29.

Roohparvar, F., Powerpoint Presentation, Flash Memory Summit, "The Future of Wireless Flash", Aug. 2006, pp. 1-29.

"Simplify MLC NAND Design with Toshiba Embedded NAND Solutions", http://www.toshiba.com/taec/adinfo/embeddednand/, retrieved on Aug. 4, 2009, 2 pages.

Toshiba LBA-NAND Simplifies Integration, http://www.toshiba.com/taec/adinfo/embeddednand/images/LBAblockDiagram.jpg, retrieved on Aug. 4, 2009, 1 page.

Cooke, "Micron e-MMC Embedded Memory Simplifies High Capacity Storage for Mobile and Embedded Solutions," 2007, 7 pages.

Abraham, "Flash Standards for Embedded Systems," Aug. 2008, 22 pages.

Ex Parte Quayle Action for U.S. Appl. No. 11/326,336, dated Jul. 30, 2009, 13 pages.

Office Action for U.S. Appl. No. 11/806,701 dated Jun. 22, 2009, 35 pages.

Office Action for U.S. Appl. No. 11/806,702, dated Jun. 18, 2009, 14 pages.

"Open NAND Flash Interface Specification", Revision 2.1, Jan. 14, 2009, pp. 1-201.

"Samsung Electronics Develops World's First Eight-Die Multi-Chip Package for Multimedia Cell Phones", http://www.samsung.com/us/business/seimconductor/newsView.do?news_id=628.0, Jan. 10, 2005.

Schwaderer, W. et al., "Understanding I/O Subsystems, First Edition", *Adaptec Press*, 1996, pp. ii-iii, 82-87, 176-191.

Serial ATA, "High Speed Serialized AT Attachment", Revision 1.0a, Jan. 7, 2003, 2 pages (title page and p. 144).

Supplemental European Search Report and Opinion for European Patent Application No. 06796108.6, May 7, 2009, 8 pages.

Toshiba TC58NVG1S3BFT00/TC58NVG1S8BFT000 Tentative, Toshiba MOS Digital Integrated Circuit Silicon Gate CMOS, Oct. 30, 2003, pp. 1-37.

Toshiba TC58NVG2D4BFT00/TC58NVG2D9BFT000 Tentative, Toshiba MOS Digital Integrated Circuit Silicon Gate CMOS, Oct. 30, 2003, pp. 1-37.

U.S. Appl. No. 12/165,141 entitled, "Partial Scrambling to Reduce Correlation," filed Jun. 30, 2008, inventors: Ori Stern, Tal Heller, and Menahem Lasser.

U.S. Appl. No. 12/199,023 entitled, "A Portable Storage Device With an Accelerated Access Speed", filed Aug. 27, 2008, inventors: Judah Gamliel and Donald Ray Bryant-Rich.

U.S. Appl. No. 12/209,697 entitled, "Method for Scrambling Data in which Scrambling Data and Scrambled Data are Stored in Corresponding Non-Volatile Memory Locations," filed Sep. 12, 2008, inventors: Jun Wan, Yupin K. Fong, and Man L. Mui.

U.S. Appl. No. 12/251,820 entitled, "Method for Page- and Block Based Scrambling in Non-Volatile Memory," filed Oct. 15, 2008, inventors: Eran Sharon and Idan Alrod.

U.S. Appl. No. 12/539,394 entitled, "Controller and Method for Interfacing Between a Host Controller in a Host and a Flash Memory Device", filed Aug. 11, 2009, inventors: Eliyahou Harari, Richard R. Heye and Robert D. Selinger.

U.S. Appl. No. 12/539,407, entitled, "Controller and Method for Detecting a Transmission Error Over a NAND Interface Using Error Detection Code", filed Aug. 11, 2009, inventor: Robert D. Selinger.

U.S. Appl. No. 12/539,417 entitled, "NAND Flash Memory Controller Exporting a NAND Interface", filed Aug. 11, 2009, inventors: Eliyahou Harari, Richard R. Heye, Robert D. Selinger and Menahem Lasser.

U.S. Appl. No. 12/539,379 entitled, "Controller and Method for Providing Read Status and Spare Block Management Information in a Flash Memory System," filed Aug. 11, 2009, inventor: Robert D. Selinger.

"USB 2.0 High-Speed Flash Drive Controller, ST72681", Revision Feb. 6, 2009 (previous revisions May 2005-Jan. 2009), pp. 1-34.

Wikipedia, "Southbridge (Computing)", http://en.wikipedia.org/wiki/Southbridge_(computing), Retrieved on Aug. 4, 2009, pp. 1-2.

Extended European Search Report and Opinion for European Patent Application No. 09009022.6-1233, Sep. 21, 2009, 9 pages.

"ONFI Working on Next-Generation NAND Specifications: ONFI 3.0 and EZNAND," 1 page, Jan. 6, 2010.

"Micron NAND Flash Memory: MT29F4G08AAA, MT29F8G08BAA, MT29F8GO8DAA, MT29F16G08FAA," http://download.micron.com/pdf/datasheets/flash/nand/4qb_nand_m40a.gclf, 1 page, 2006.

"Siemens Internal Flash Data Management," 2 pages, Siemens AG 2006.

Examination Report for EP Application No. 09009022.6-1233, 6 pages, May 4, 2010.

Examination Report for EP Application No. 06796108.6-1233, 5 pages, Feb. 17, 2010.

Notice of Ground for Refusal for Korean Patent Application No. 10-2008-7007225, 5 pages, May 11, 2010.

Office Action directed against U.S. Appl. No. 11/806,701, 27 pages, Feb. 25, 2010.

Office Action directed against U.S. Appl. No. 11/806,702, 9 pages, Feb. 25, 2010.

U.S. Appl. No. 12/650,255 entitled, "Method and Controller for Performing a Sequence of Commands," filed Dec. 30, 2009, inventors: Robert D. Selinger, Gary Lin, and Chaoyang Wang.

Brown, "White Paper: Flash Memory", Oct. 2007, pp. 70-71.

Chang, "On Efficient Wear Leveling for Large-Scale Flash-Memory Storage Systems", Mar. 15, 2007, pp. 1127-1130.

Clause 8.2.3 and other sections of Clause 8, SCSI-2 Specification, 1994, 73 pages.

Open NAND Flash Interface (ONFI) Specification, Revision 2.0, Feb. 27, 2008, 174 pages.

"SanDisk Flash Memory Cards Wear Leveling", Oct. 2003, pp. 1-6.

Solomon, "Microsoft Windows Internals: Microsoft Windows Server tm 2003, Windows XP and Windows 2000, Fourth Edition", Dec. 8, 2004, pp. xi, 280, 373, 564.

Invitation to Pay Additional Fees for PCT/US2010/057386, dated Sep. 12, 2011, 5 pages.

International Search Report and Written Opinion for PCT/US2010/057386, dated Feb. 28, 2012, 19 pages.

Office Action for U.S. Appl. No. 12/338,378, dated May 4, 2011, 23 pages.

Office Action for U.S. Appl. No. 12/338,378, dated Apr. 26, 2012, 15 pages.

Restriciton Requirement for U.S. Appl. No. 12/544,529, dated May 10, 2011, 22 pages.

Office Action for U.S. Appl. No. 12/544,529, dated Mar. 23, 2012, 12 pages.

U.S. Appl. No. 12/338,378 etntitled, Methods for Writing Data from a Source Location in a Memory Device, filed Dec. 18, 2008, inventors: Ori Stern, Micha Rave, Robert Selinger, and Sandra Almog Goldschmidt.

* cited by examiner

METHOD AND CONTROLLER FOR PERFORMING A COPY-BACK OPERATION

BACKGROUND

NAND flash memory devices are commonly used to store data by a host, such as a personal computer. A host can communicate with a NAND flash memory device using a NAND interface, such as Open NAND Flash Interface (ONFI), for example. One example of a command that a host can send to a NAND flash memory device is a "copy-back" command. In operation, the host sends a source address and a copy-back read command to the NAND flash memory device, in response to which the NAND flash memory device reads data from the source address in its non-volatile memory and writes the data in a register internal to the NAND flash memory device. Next, the host sends a destination address and a copy-back program command to the NAND flash memory device, in response to which the NAND flash memory device reads the data out of the register and writes it to the destination address in its non-volatile memory. Because the data is not sent back to the host, a copy-back operation avoids occupying the communication bus between the host and the NAND flash memory device and avoids requiring the host to allocate processing power and overhead to perform standard read and program operations to move the data. However, although any error correction code (ECC) bits stored with the data are also moved, the NAND flash memory device does not perform ECC checking and error correction on the data. Accordingly, any errors existing in the data would be propagated.

SUMMARY

The present invention is defined by the claims, and nothing in this section should be taken as a limitation on those claims.

By way of introduction, the embodiments described below provide a method and controller for performing a copy-back operation. In one embodiment, a controller in communication with a host and at least one flash memory device receives a source address and a copy-back read command from the host. The controller sends the source address and the copy-back read command to the at least one flash memory device, in response to which the at least one flash memory device reads data from the source address and writes the data in a register in the at least one flash memory device. The controller receives the data and error correction code associated with the data from the at least one flash memory device and receives a destination address and a copy-back program command from the host. The controller determines if the error correction code indicates there is an error in the data. If the error correction code does not indicate there is an error in the data, the controller sends the destination address and the copy-back program command to the at least one flash memory device, in response to which the at least one flash memory device reads the data out of the register and writes the data to the destination address in the at least one flash memory device. If the error correction code indicates there is an error in the data, the controller corrects the data and sends the destination address, the corrected data, and a program command to the at least one flash memory device. Additional embodiments relate to modifying data during the copy-back operation.

Other embodiments are disclosed, and each of the embodiments can be used alone or together in combination. The embodiments will now be described with reference to the attached drawings.

DETAILED DESCRIPTION OF THE PRESENTLY PREFERRED EMBODIMENTS

Introduction

The following embodiments are directed to flash memory controllers and methods for use therewith. In one embodiment, a controller and method are provided for performing a copy-back command. Before turning to this and other embodiments, a general overview of exemplary controller architectures and a discussion of NAND interfaces and NAND interface protocols are provided.

Exemplary Controller Architectures

Figure 1:
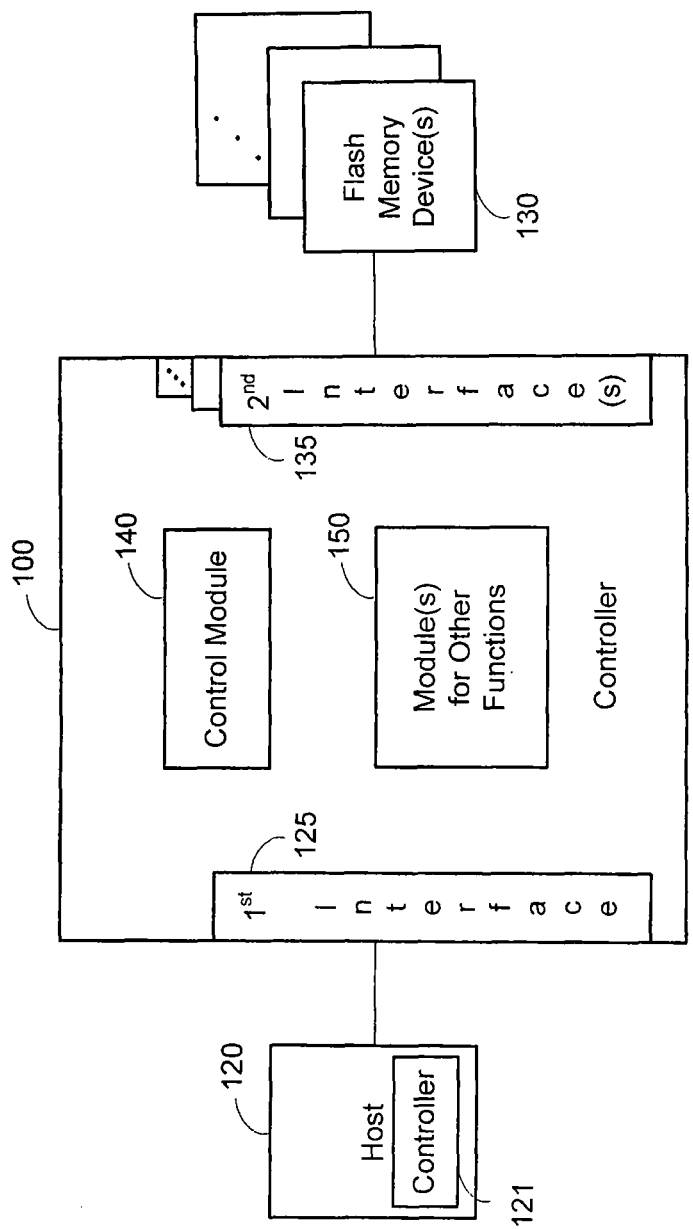
FIG. 1 is a block diagram of a system of an embodiment comprising a controller, a host, and one or more flash memory devices.

Turning now to the drawings, FIG. 1 is a system of an embodiment in which a controller 100 is in communication with a host 120 (having a host controller 121) through a first interface 125 and is in communication with one or more flash memory device(s) 130 through one or more second interface(s) 135. (The number of second interface(s) 135 can match the number of flash memory device(s) 130, or the number of second interface(s) 135 can be greater than or less than the number of flash memory device(s) 130 (e.g., a single second interface 135 can support multiple flash memory device(s)).) As used herein, the phrase "in communication with" means directly in communication with or indirectly in communication with through one or more components, which may or may not be shown or described herein.

A "host" is any entity that is capable of accessing the one or more flash memory device(s) 130 through the controller 100, either directly or indirectly through one or more components named or unnamed herein. A host can take any suitable form, such as, but not limited to, a personal computer, a mobile phone, a game device, a personal digital assistant (PDA), an email/text messaging device, a digital camera, a digital media (e.g., MP3) player, a GPS navigation device, a personal navigation system (PND), a mobile Internet device (MID), and a TV system. Depending on the application, the host 120 can take the form of a hardware device, a software application, or a combination of hardware and software.

"Flash memory device(s)" refer to device(s) containing a plurality of flash memory cells and any necessary control circuitry for storing data within the flash memory cells. In one embodiment, the flash memory cells are NAND memory cells, although other memory technologies, such as passive element arrays, including one-time programmable memory elements and/or rewritable memory elements, can be used. (It should be noted that, in these embodiments, a non-NAND-type flash memory device can still use a NAND interface and/or NAND commands and protocols.) One example of a passive element array is a three-dimensional memory array. As used herein, a three-dimensional memory array refers to a memory array comprising a plurality of layers of memory cells stacked vertically above one another above a single silicon substrate. In this way, a three-dimensional memory array is a monolithic integrated circuit structure, rather than a plurality of integrated circuit devices packaged or die-bonded in close proximity to one another. Although a three-dimensional memory array is preferred, the memory array can instead take the form of a two-dimensional (planar) array. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 6,034,882; 6,185,122; 6,420,215; 6,631,085; and 7,081,377. Also, the flash memory device(s) 130 can be a single memory die or multiple memory dies. Accordingly, the phrase "a flash memory device" used in the claims can refer to only one flash memory device or more than one flash memory device.

As shown in FIG. 1, the controller 100 also comprises a control module 140 for controlling the operation of the controller 100 and performing a memory operation based on a command (e.g., read, write, erase, etc.) and an address received from the host 120. As used herein, a "module" can include hardware, software, firmware, or any combination thereof. Examples of forms that a "module" can take include, but are not limited to, one or more of a microprocessor or processor and a computer-readable medium that stores computer-readable program code (e.g., software or firmware) executable by the (micro)processor, logic gates, switches, an application specific integrated circuit (ASIC), a programmable logic controller, and an embedded microcontroller, for example. (The following sections provide examples of the various forms a "module" can take.) As shown in FIG. 1, the controller 100 can include one or more additional modules 150 for providing other functionality, including, but not limited to, data scrambling, column replacement, handling write aborts and/or program failures (via safe zones), read scrubbing, wear leveling, bad block and/or spare block management, error correction code (ECC) functionality, error detection code (EDC) functionality, status functionality, encryption functionality, error recovery, and address mapping (e.g., mapping of logical to physical blocks). The following sections provide more details on these functions, as well as additional examples of other functions.

Figure 2A:
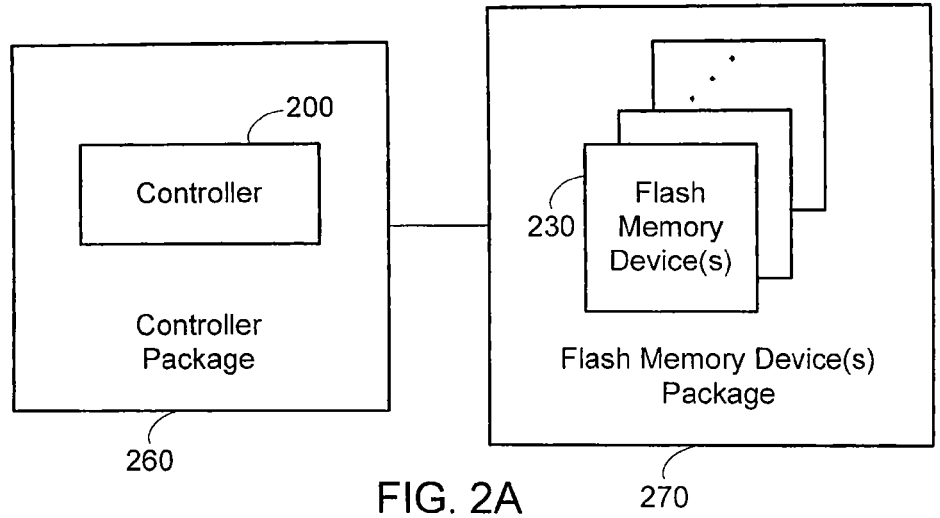
FIGS. 2A, 2B, and 2C are block diagrams illustrating different arrangements of a controller and flash memory device(s) of an embodiment.
Figure 2B:
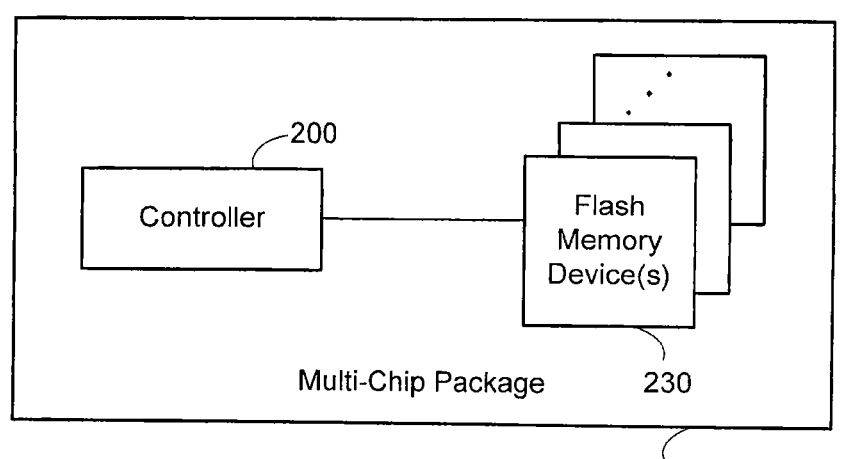
Figure 2C:
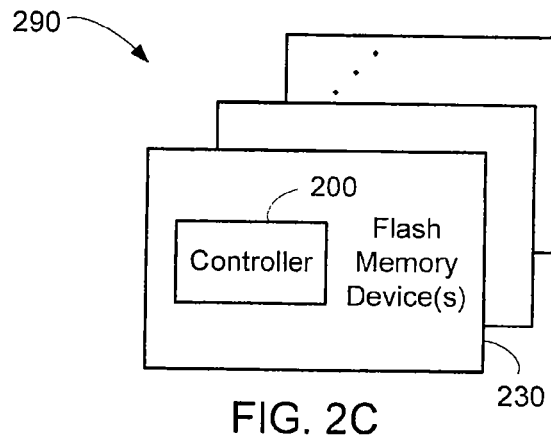

While the controller 100 and flash memory device(s) 130 are shown as two separate boxes in FIG. 1, it should be understood that the controller 100 and flash memory device(s) 130 can be arranged in any suitable manner. FIGS. 2A, 2B, and 2C are block diagrams illustrating different arrangements of the controller and flash memory device(s). In FIG. 2A, the controller 200 and the flash memory device(s) 230 are packaged in different packages 260, 270. In this embodiment, an inter-die interface can interface between the controller 200 and the flash memory device(s) 230. As used herein, an "inter-die interface" (e.g., an inter-die NAND interface) is operative to interface between two distinct units of electronic circuitry residing on distinct dies (e.g., to provide the necessary physical and logical infrastructure for the distinct units of electronic circuitry to communicate with each other, for example, using one or more specific protocols). Thus, the inter-die interface includes the necessary physical elements (e.g., pads, output, input drivers, etc.) for interfacing between the two distinct units of electronic circuitry residing on separate dies.

In FIG. 2B, the controller 200 and the flash memory device(s) 230 both reside within a common multi-chip package 280. In this embodiment, an inter-die interface can interface between the controller 200 and the flash memory device(s) 230 fabricated on two distinct dies that are packaged in the common multi-chip package 280. In FIG. 2C, the controller 200 and the flash memory device(s) 230 are integrated on a same die 290. As another alternative, the controller 200 and/or flash memory device(s) 230 can be fabricated on two distinct dies, where one or both of these dies has no package at all. For example, in many applications, due to a need to conserve space, memory dies are mounted on circuit boards with no packaging at all.

It should be noted that in each of these arrangements, the controller 200 is physically located separately from the host. This allows the controller 200 and flash memory device(s) 230 to be considered a separate circuitry unit, which can be used in a wide variety of hosts.

As noted above with reference to FIG. 1, the controller 100 communicates with the host 120 using a first interface 125 and communicates with the flash memory device(s) 130 using second interface(s) 135. In general, the first and second interfaces 125, 135 can take any suitable form. However, in a presently preferred embodiment, which will be described below in conjunction with FIG. 3, the first and second interfaces 125, 135 are both NAND interfaces that use NAND interface protocols. Before turning to FIG. 3, the following section provides a general discussion of NAND interfaces and NAND interface protocols.

NAND Interfaces and NAND Interface Protocols

A NAND interface protocol is used to coordinate commands and data transfers between a NAND flash device and a host using, for example, data lines and control signals, such as ALE (Address Latch Enable), CLE (Command Latch Enable), and WE#(Write Enable). Even though the term "NAND interface protocol" has not, to date, been formally standardized by a standardization body, the manufacturers of NAND flash devices all follow very similar protocols for supporting the basic subset of NAND flash functionality. This is done so that customers using NAND devices within their electronic products could use NAND devices from any manufacturer without having to tailor their hardware or software for operating with the devices of a specific vendor. It is noted that even NAND vendors that provide extra functionality beyond this basic subset of functionality ensure that the basic functionality is provided in order to provide compatibility with the protocol used by the other vendors, at least to some extent.

A given device (e.g., a controller, a flash memory device, a host, etc.) is said to comprise, include, or have a "NAND interface" if the given device includes elements (e.g., hardware, software, firmware, or any combination thereof) necessary for supporting the NAND interface protocol (e.g., for interacting with another device using a NAND interface protocol). (As used herein, the term "interface(s)" can refer to a single interface or multiple interfaces. Accordingly, the term "interface" in the claims can refer to only one interface or more than one interface.) In this application, the term "NAND Interface protocol" (or "NAND interface" in short) refers to an interface protocol between an initiating device and a responding device that, in general, follows the protocol between a host and a NAND flash device for the basic read, write, and erase operations, even if it is not fully compatible with all timing parameters, not fully compatible with respect to other commands supported by NAND devices, or contains additional commands not supported by NAND devices. One suitable example of a NAND interface protocol is an interface protocol that uses sequences of transferred bytes equivalent in functionality to the sequences of bytes used when interfacing with a Toshiba TC58NVG1S3B NAND device (or a Toshiba TC58NVG2D4B NAND device) for reading (opcode 00H), writing (opcode 80H), and erasing (opcode 60H), and also uses control signals equivalent in functionality to the CLE, ALE, CE, WE, and RE signals of the above NAND device.

It is noted that a NAND interface protocol is not symmetric in that the host—not the flash device—initiates the interaction over a NAND interface. Further, an interface (e.g., a NAND interface or an interface associated with another protocol) of a given device (e.g., a controller) may be a "host-side interface" (e.g., the given device is adapted to interact with a host using the host-side interface), or the interface of the given device may be a "flash memory device-side interface" (e.g., the given device is adapted to interact with a flash memory device using the flash memory device-side interface). The terms "flash memory device-side interface," "flash device-side interface," and "flash-side interface" are used interchangeably herein.

These terms (i.e., "host-side interface" and "flash device-side interface") should not be confused with the terms "host-type interface" and "flash-type interface," which are terminology used herein to differentiate between the two sides of a NAND interface protocol, as this protocol is not symmetric. Furthermore, because it is the host that initiates the interaction, we note that a given device is said to have a "host-type interface" if the device includes the necessary hardware and/or software for implementing the host side of the NAND interface protocol (i.e., for presenting a NAND host and initiating the NAND protocol interaction). Similarly, because the flash device does not initiate the interaction, we note that a given device is said to have a "flash-type interface" if the device includes the necessary hardware and/or software for implementing the flash side of the NAND protocol (i.e., for presenting a NAND flash device).

Typically, "host-type interfaces" (i.e., those which play the role of the host) are "flash device-side interfaces" (i.e., they interact with flash devices or with hardware emulating a flash device) while "flash device-type interfaces" (i.e., those which play the role of the flash device) are typically "host-side interfaces" (i.e., they interact with hosts or with hardware emulating a host).

Because of the complexities of NAND devices, a "NAND controller" can be used for controlling the use of a NAND device in an electronic system. It is possible to operate and use a NAND device directly by a host with no intervening NAND controller; however, such architecture suffers from many disadvantages. First, the host has to individually manipulate each one of the NAND device's control signals (e.g., CLE or ALE), which is cumbersome and time-consuming for the host. Second, the support of error correction code (ECC) puts a burden on the host. For at least these reasons, "no controller" architectures are usually relatively slow and inefficient.

In some conventional controller architectures, a NAND controller interacts with a flash memory device using a NAND interface and interacts with a host using a standard, non-NAND interface, such as USB or SATA. That is, in these conventional controller architectures, the NAND controller does not export a NAND interface to the host. Indeed, this is reasonable to expect, as a host processor that does not have built-in NAND support and requires an external controller for that purpose typically does not have a NAND interface and cannot directly connect to a device exporting a NAND interface and, therefore, has no use of a controller with a host-side NAND interface. On the other hand, a host processor that has built-in NAND support typically also includes a built-in NAND controller and can connect directly to a NAND device, and, therefore, has no need for an external NAND controller.

"NAND Flash Memory Controller Exporting a NAND Interface," U.S. Pat. No. 7,631,245, which is hereby incorporated by reference, discloses a new type of NAND controller, characterized by the fact that the interface it exports to the host side is a NAND interface. In this way, the NAND controller exports to the host the same type of interface that is exported by a standard NAND flash memory device. The controller also preferably has a NAND interface on the flash memory device side as well, where the controller plays the role of a host towards the NAND flash memory device and plays the role of a NAND device towards the host.

Exemplary NAND Flash Memory Controller Exporting a NAND Interface

Figure 3:
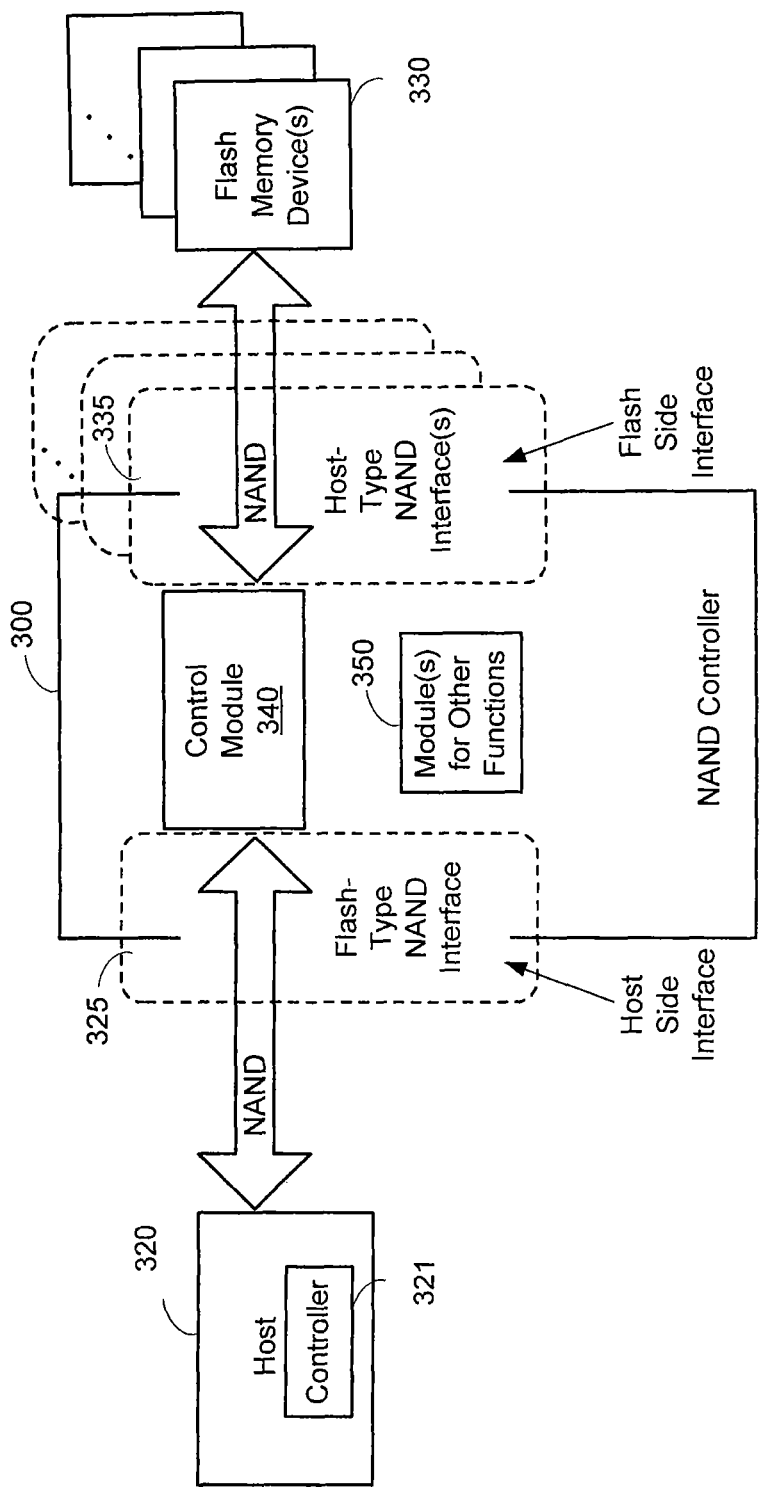
FIG. 3 is a block diagram of an exemplary controller of an embodiment.

Returning to the drawings, FIG. 3 is a block diagram of an exemplary controller 300 of an embodiment. As shown in FIG. 3, the controller 300 includes a control module 340 for controlling the operation of the controller 300 and, optionally, one or more additional modules 350 for providing other functions. Examples of other functions include, but are not limited to, data scrambling, column replacement, handling write aborts and/or program failures (via safe zones), read scrubbing, wear leveling, bad block and/or spare block management, error correction code (ECC) functionality, error detection code (EDC) functionality, status functionality, encryption functionality, error recovery, and address mapping (e.g., mapping of logical to physical blocks). The following paragraphs describe some of these functions, and sections later in this document describe others of these functions.

"Data scrambling" or "scrambling" is an invertible transformation of an input bit sequence to an output bit sequence, such that each bit of the output bit sequence is a function of several bits of the input bit sequence and of an auxiliary bit sequence. The data stored in a flash memory device may be scrambled in order to reduce data pattern-dependent sensitivities, disturbance effects, or errors by creating more randomized data patterns. More information about data scrambling can be found in the following patent documents: U.S. patent application Ser. Nos. 11/808,906, 12/209,697, 12/251, 820, 12/165,141, and 11/876,789, as well as PCT application no. PCT/US08/88625.

"Column replacement" refers to various implementations of mapping or replacing entirely bad columns, portions of columns, or even individual cells. Suitable types of column replacement techniques can be found in U.S. Pat. Nos. 7,379, 330 and 7,447,066.

There are several potential problems in writing to flash memory devices where logically or physically adjacent data may be corrupted outside of the location where the data is attempted to be written. One example is when a write to one area (e.g., a cell, page, or block) of memory fails, and the contents of some surrounding memory may be corrupted. This is referred to as a "program failure" or "program disturb." A similar effect known as "write abort" is when a write (or program) operation is terminated prematurely, for example when power is removed unexpectedly. In both cases, there are algorithms which may be used to pro-actively copy data from a "risk zone" to a "safe zone" to handle write aborts and program failures, as described in U.S. Pat. No. 6,988,175.

"Read scrubbing" or, more generally, "scrubbing" refers to the techniques of refreshing and correcting data stored in a flash memory device to compensate for disturbs. A scrub operation entails reading data in areas that may have received exposure to potentially disturbing signals and performing some corrective action if this data is determined to have been disturbed. Read scrubbing is further described in U.S. Pat. Nos. 7,012,835, 7,224,607, and 7,477,547.

Flash memory devices may be written unevenly, and "wear leveling" refers to techniques that attempt to even out the number of times memory cells are written over their lifetime. Exemplary wear leveling techniques are described in U.S. Pat. Nos. 6,230,233 and 6,594,183.

In general, flash memory devices are manufactured with an excess number of blocks (greater than the defined minimum capacity). Either during factory testing or during use of the device, certain blocks may be discovered as "bad" or "defective," meaning that they are unable to correctly store data and need to be replaced. Similarly, there may be an excess of "good" blocks (greater than the defined minimum capacity) which may be used as "spares" until another block fails or becomes defective. Keeping track of these extra blocks is known as bad block management and spare block management, respectively. More information about bad block and spare block management can be found in U.S. Pat. No. 7,171,536.

As mentioned above, additional information about these different functional modules and how they are used in exemplary controller architectures is provided later in this document.

Returning to the drawings, as also shown in FIG. 3, the controller 300 includes one or more flash memory device-side NAND interface(s) 335 for interfacing with one or more NAND flash device(s) 330 (e.g., 1-8 memory dies). Furthermore, it is noted that the flash memory device-side NAND interface 335 is also a host-type NAND interface (i.e., that it is adapted to initiate the interaction over the NAND interface and to present a host to a NAND flash device(s) 330). The controller 300 also includes a host side NAND interface 325 for interfacing to a host 320 (having a host controller 321) that supports a NAND interface protocol. This host side NAND interface 325 is also a flash memory-type NAND interface (e.g., the controller 300 is adapted to present to the host 320 a NAND flash memory storage device). Examples of NAND interfaces include, but are not limited to, Open NAND Flash Interface (ONFI), toggle mode (TM), and a high-performance flash memory interface, such as the one described in U.S. Pat. No. 7,366,029, which is hereby incorporated by reference. The controller 300 may optionally include one or more additional host-side interfaces, for interfacing the controller 300 to hosts using non-NAND interfaces, such as SD, USB, SATA, or MMC interfaces. Also, the interfaces 325, 335 can use the same or different NAND interface protocols.

It should be noted that the controller 300 and flash memory device(s) 330 can be used in any desired system environment. For example, in one implementation, a product manufactured with one or more controller 300/flash memory device(s) 330 units is used in a solid-state drive (SSD). As another example, the controller 300 can be used in OEM designs that use a Southbridge controller to interface to flash memory devices.

There are several advantages of using a NAND flash memory controller that exports a NAND interface to a host. To appreciate these advantages, first consider the realities of current controller architectures. Today, there are two types of NAND interfaces: a "raw" interface and a "managed" interface. With a raw interface, the basic memory is exposed with primitive commands like read, program, and erase, and the external controller is expected to provide memory management functions, such as ECC, defect management, and flash translation. With a managed interface, through some higher level interface, logical items such as sectors/pages/blocks or files are managed, and the controller manages memory management functions.

However, the set of firmware required to "manage" the NAND can be divided into two categories. The first category is generic flash software that mostly manages the host interface, objects (and read/modify/write sequences), and caching. This is referred to as the "host management" layer. The second category is flash-specific management functionality that does, for example, the ECC, data scrambling, and specific error recovery and error prevention techniques like pro-active read scrubbing and copying lower-page blocks to prevent data loss due to write aborts, power failures, and write errors. This is referred to as the "device management" layer.

The first category of software is relatively constant and may be provided by various companies, including OS vendors, chipset and controller vendors, and embedded device vendors. In general, let's assume there are M specific systems/OSes/ASICs that may want to use flash in their designs. The second set is potentially proprietary to individual companies and even specific to certain memory designs and generations. In general, let's assume there are N different memory specific design points. Today, this is an all-or-nothing approach to flash management—either buy raw NAND or managed NAND. This also means that a solution must incorporate one of the M system and host management environments with one of the N memory device management environments. In general, this means that either (1) a flash vendor with the second kind of knowledge must provide all layers of a solution, including ASIC controller and host interface software, and do M different designs for the M different host opportunities, or (2) any independent ASIC and firmware company has little opportunity to customize their solutions to specific memory designs without doing N different designs, or (3) two companies have to work together, potentially exposing valuable trade secrets and IP and/or implement different solutions for each memory design. This can also produce a time-to-market delay if M different host solutions have to be modified to accept any new memory design or vice versa.

By using a NAND flash memory controller that exports a NAND interface to a host, a new logical interface is provided that uses existing physical NAND interfaces and commands, such as legacy asynchronous, ONFI, or TM, to create a new logical interface above raw or physical NAND and below logical or managed NAND, create "virtual" raw NAND memory with no ECC required in the host controller, and disable host ECC (since 0 ECC is required from the host to protect the NAND memory). This new logical interface also can provide, for example, data scrambling, scrubbing, disturbs, safe zone handling, wear leveling, and bad block management (to only expose the good blocks) "beneath" this interface level.

This different logical interface provides several advantages over standard flash interfaces or managed NAND interfaces, including ONFI Block Abstraction (BA) or Toshiba LBA. For example, separation of the memory-specific functions that may vary from memory type and generation (e.g., NAND vs. 3D (or NOR) and 5xnm vs. 4xnm vs. 3xnm) allows for different amounts of ECC, vendor-unique and memory-unique schemes for error prevention and correction schemes, such as handling disturbs and safe zones, and allows vendor-unique algorithms to remain "secret" within the controller and firmware. Additionally, there is greater commonality between technology (and vendors) at this logical interface level, which enables quicker time to market. Further, this allows much closer to 1:1 command operation, meaning improved and more-predictable performance versus managed NAND or other higher level interfaces.

There are additional advantages associated with this controller architecture. For example, it allows for independent development, test, and evolution of memory technology from the host and other parts of the system. It can also allow for easier and faster deployment of next generation memories, since changes to support those memories are more localized. Further, it allows memory manufactures to protect secret algorithms used to manage the raw flash. Also, page management can be integrated with the file system and/or other logical mapping. Thus, combined with standard external interfaces (electrical and command sets), this architecture makes it easier to design in raw flash that is more transparent from generation to generation.

There is at least one other secondary benefit from the use of this architecture—the controller 300 only presents a single electrical load on the external interface and drives the raw flash internal to the MCP. This allows for potentially greater system capacity without increasing the number of flash channels, higher speed external interfaces (since fewer loads), and higher-speed internal interfaces to the raw flash devices (since very tightly-controlled internal design (substrate connection) is possible).

Another advantage associated with the controller of this embodiment is that is can be used to provide a "split bus" architecture through the use of different host and memory buses, potentially at different speeds (i.e., the bus between the host and the controller can be different from the bus between the controller and the flash memory device(s)). (As used herein, a "bus" is an electrical connection of multiple devices (e.g., chips or dies) that have the same interface. For example, a point-to-point connection is a bus between two devices, but most interface standards support having multiple devices connected to the same electrical bus.) This architecture is especially desired in solid-state drives (SSDs) that can potentially have hundreds of flash memory devices. In conventional SSD architectures, the current solution is to package N normal flash memory devices in a multi-chip package (MCP), but this still creates N loads on a bus, creating N times the capacitance and inductance. The more loads on a bus, the slower it operates. For example, one current architecture can support a 80 MHz operation with 1-4 devices but can support only a 40 MHz operation with 8-16 devices. This is the opposite of what is desired—higher speeds if more devices are used. Furthermore, more devices imply the need for greater physical separation between the host and the memory MCPs. For example, if 16 packages were used, they will be spread over a relatively large physical distance (e.g., several inches) in an arbitrary topology (e.g., a bus or star-shaped (or arbitrary stub) topology). This also reduces the potential performance of any electrical interface. So, to obtain, for example, 300 MHz of transfers (ignoring bus widths), either four fast buses or eight slow buses can be used. But, the fast buses could only support four flash memory devices each, or 16 total devices, which is not enough for most SSDs today. If the buses run faster, the number of interface connections (pins and analog interfaces) can be reduced, as well as potentially the amount of registers and logic in the host.

Because the controller 300 in this embodiment splits the interconnection between the host and the raw flash memory device(s) into a separate host side interface and a flash side interface with a buffer in between, the host bus has fewer loads and can run two to four times faster. Further, since the memory bus is internal to the MCP, it can have lower power, higher speed, and lower voltage because of the short distance and finite loads involved. Further, the two buses can run at different frequencies and different widths (e.g., one side could use an 8-bit bus, and the other side can use a 16-bit bus).

While some architectures may insert standard transceivers to decouple these buses, the controller 300 of this embodiment can use buffering and can run these interfaces at different speeds. This allows the controller 300 to also match two different speed buses, for example, a flash side interface bus running at 140 MB/sec and an ONFI bus that runs at either 132 or 166 MB/sec. A conventional bus transceiver design would have to pick the lower of the two buses and run at 132 MB/sec in this example, while the controller 300 of this embodiment can achieve 140 MB/sec by running the ONFI bus at 166 MB/sec and essentially have idle periods. Accordingly, the controller 300 of this embodiment provides higher performance at potentially lower cost and/or lower power and interface flexibility between different products (e.g., different speed and width host and memory buses, fewer loads on the host in a typical system (which enables faster operation and aggregation of the memory bus bandwidth to the host interface), and different interfaces on the host and memory side with interface translation).

As mentioned above, a single controller can also have multiple flash side interface(s) 335 to the flash memory device(s), which also enables further parallelism between raw flash memory devices and transfers into the controller, which allows the flash side interface to run slower (as well as faster) than the host side interface 325. A single controller can also have multiple host side interfaces that may be connected to different host controller interfaces to allow for greater parallelism in accessing the flash memory device(s), to share the controller, or to better match the speed of the flash side interface (which could be faster than the host side interface for the reasons described above).

Another advantage of importing a NAND interface to a host relates to the use of a distributed controller architecture. Today, flash memory devices are typically implemented with a single level of controller. In large solid-state drives (SSDs), there may be tens or even hundreds of flash devices. In high-performance devices, it may be desirable to have parallel operations going on in as many of these flash devices as possible, which may be power constrained. There are interface specs today at 600 MB/sec, and these are still increasing. To reach this level of performance requires very fast controllers, memories, and ECC modules. Today, high performance controllers are built with either one or a small number of ECC modules and one or two microprocessors to handle memory device management. Since some of the functions are very localized to the memory devices themselves, such as ECC, with the controller 300 of this embodiment, a two-tiered network of devices can be utilized. Specifically, the host 320 can manage the host interface and high-level mapping of logical contents, and one or more controllers 300 can manage one or more raw NAND flash memory devices to provide local management of memory device functions (e.g., ECC) and parallelism in the execution of these functions due to parallel execution of the controller 300 and the host 320 and parallel execution of multiple controllers 300 handling different operations in parallel on different memories 320. In contrast to conventional controllers in SSDs, which perform memory device management functions in one place, by splitting these functions into two layers, this architecture can take advantage of parallel performance in two ways (e.g., between host and slave, and between many slaves). This enables higher total performance levels (e.g., 600 MB/sec) without having to design a single ECC module or microprocessor that can handle that rate.

Yet another advantage of this architecture is that a higher-level abstraction of the raw memory can be developed, such that system developers do not need to know about error recovery or the low-level details of the memory, such as ECC and data scrambling, since the controller 300 can be used to perform those functions in addition to handling memory-specific functions such as read, erase, and program disturbs, and safe zones. This level of support is referred to herein as "corrected" flash," which is logically in between raw flash and managed NAND. On the other hand, this architecture is not fully managed memory in the sense of page or block management at a logical level and may require the host to provide for logical-to-physical mapping of pages and blocks. However, the controller 300 can still present some flash memory management restrictions to the host and its firmware, such as: only full pages can be programmed, pages must be written in order within a block, and pages can only be written once before the entire block must be erased. Wear leveling of physical blocks to ensure that they are used approximately evenly can also be performed by the controller 300; however, the host 320 can be responsible for providing this function. Also, the controller 300 preferably presents the host 320 with full page read and write operations into pages and blocks of NAND. The characteristics of logical page size and block size will likely be the same as the underlying NAND (unless partial page operations are supported). The majority of the spare area in each physical page in the raw NAND will be used by the controller 300 for ECC and its metadata. The controller 300 can provide for a smaller number of spare bytes that the using system can utilize for metadata management.

Embodiments Relating to Detecting a Transmission Error Over a NAND Interface

With reference to FIG. 3, transmission errors may occur as data is being sent from the host 320 to the controller 300 over a NAND interface bus to the host-side NAND interface 325. Since ECC is generated and checked within the controller 300, there is no ECC protecting the data transmitted over the host-side NAND interface 325. This problem and a proposed solution will now be discussed in conjunction with FIG. 4.

Figure 4:
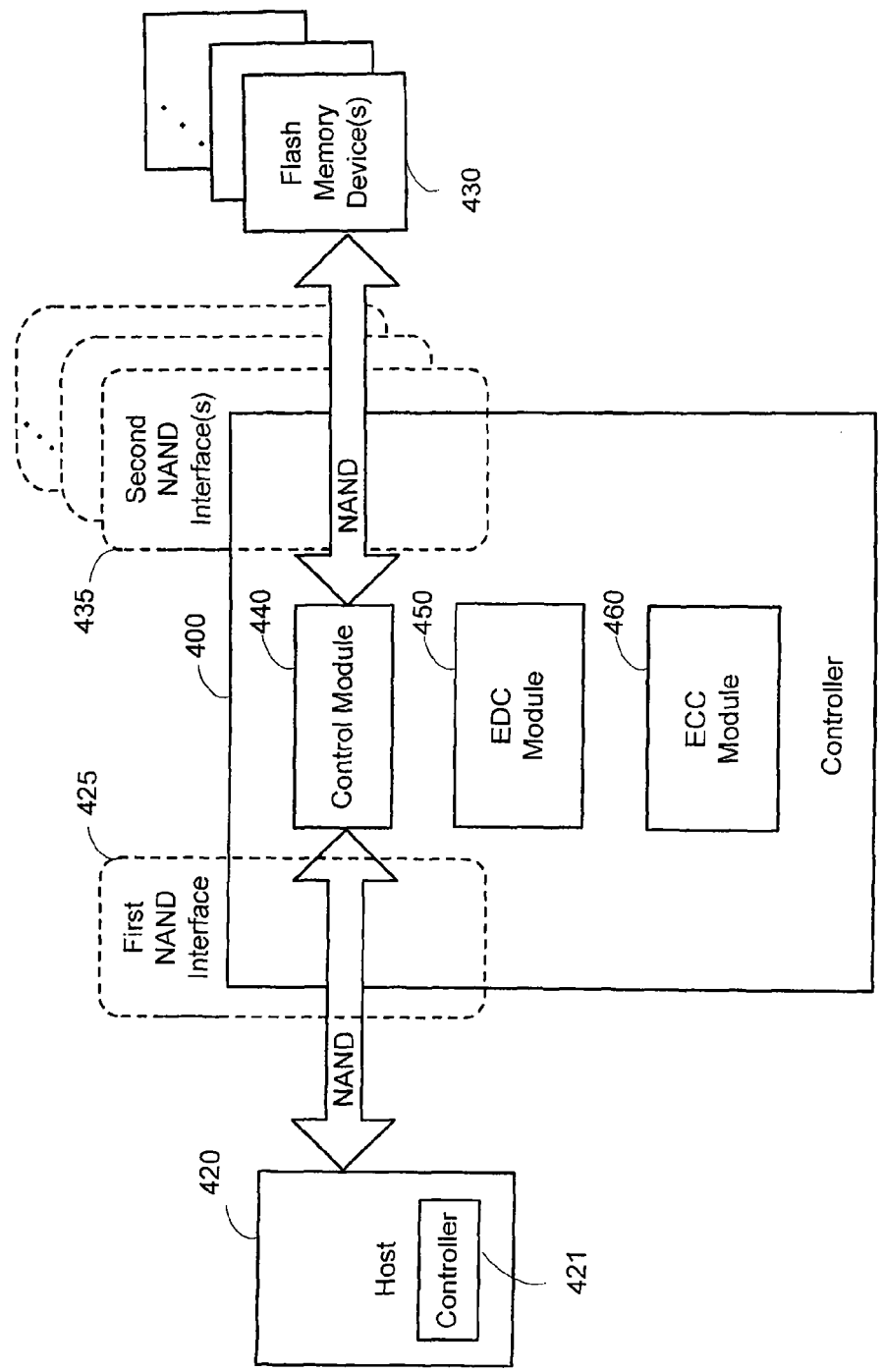
FIG. 4 is a block diagram of a controller of an embodiment for writing data to and reading data from flash memory device(s).

FIG. 4 is a block diagram of a controller 400 of an embodiment for writing data to and reading data from one or more flash memory device(s) 430. As shown in FIG. 4, the controller 400 in this embodiment comprises a first NAND interface 425 configured to transfer data between the controller 400 and a host 420 (having a host controller 421) using a NAND interface protocol, as well as second NAND interface(s) 435 configured to transfer data between the controller 400 and one or more flash memory device(s) 430 using a NAND interface protocol. As discussed above, the NAND interface protocol used by each interface 425, 435 can be the same protocol or can be different protocols. As also discussed above, the controller 400 and the flash memory device(s) 430 can be packaged in different packages, can both reside within a common multi-chip package, or can be integrated on the same die.

Also, in one embodiment, the host 420 performs logical-to-physical address mapping, so the host 420 provides the controller 400 with a physical address over the first NAND interface 425 along with a command to write or read to that physical address.

In this embodiment, the controller 400 comprises a control module 440 to control the operation of the controller 400, an error detection code (EDC) module 450 (e.g., an ECC encoder/decoder), and an error correction code (ECC) module 460 (e.g., an ECC encoder/decoder). The EDC module 450 is operative to generate an error detection code based on inputted data, and the ECC module 460 is operative to generate an error correction code based on inputted data. In this embodiment, the control module 440 is configured to correct errors using an ECC code (e.g., part of the control module 440 is an ECC correction engine). Data as used in this context can include the normal data page to be stored or retrieved as well as header, metadata, or spare fields used to store addresses, flags or data computed by either the host 420 or the controller 400. Whereas an error detection code allows at least one error to be detected but not corrected, an error correction code allows at least one error to be both detected and corrected. The number of errors that can be detected and/or corrected depends on the type of error detection code scheme and error correction code scheme that are used. Suitable types of error detection code schemes include, but are not limited to, a one or more byte checksum, a longitudinal redundancy check (LRC), a cyclic redundancy check (CRC), or an 8b/10b code. Suitable types of error correction code schemes include, but are not limited to, Hamming code and Reed-Solomon code.

Figure 5:
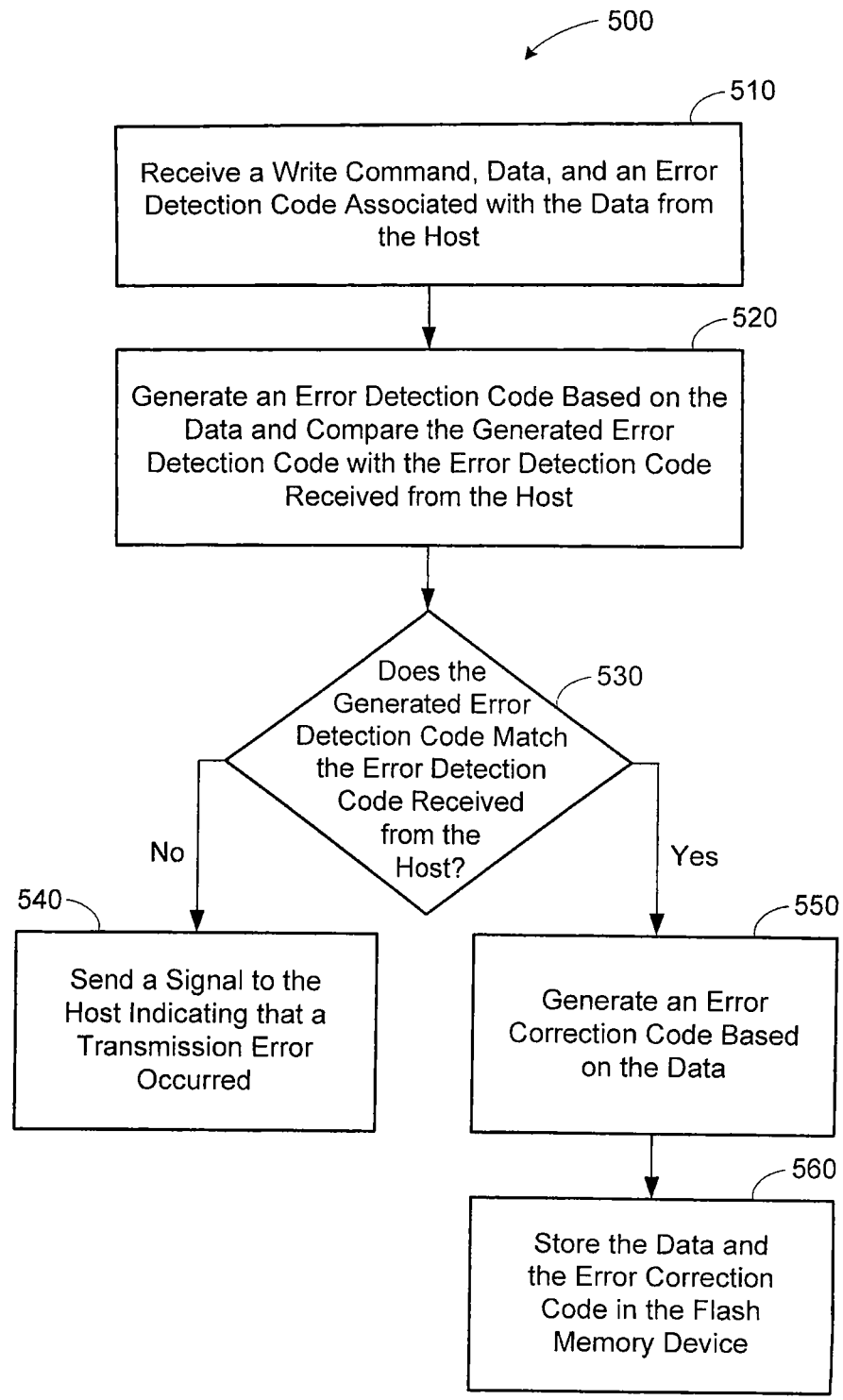
FIG. 5 is a flow chart of a method for writing data in a flash memory device using a controller of an embodiment.
Figure 6:
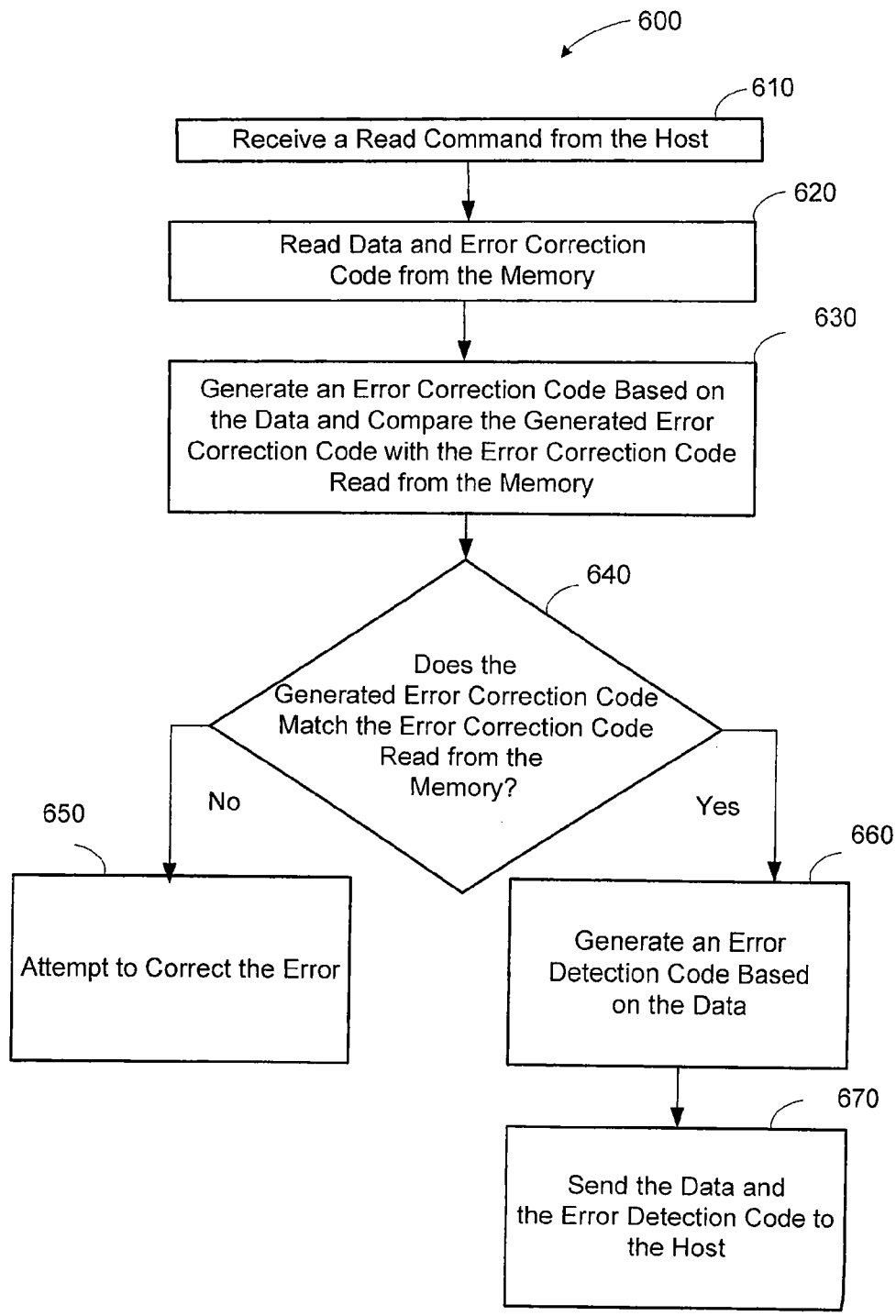
FIG. 6 is a flow chart of a method for reading data from a flash memory device using a controller of an embodiment.

FIGS. 5 and 6 are flow charts 500, 600 illustrating how the controller 400 in this embodiment is used in write and read operations, respectively. Turning first to the flow chart 500 in FIG. 5, the controller 400 receives a write command, data, and an error detection code associated with the data from the host 420 over the first NAND interface 425 (act 510). (Because the host 420 is not necessarily aware of the fact that it is issuing the command to a controller, it may assume that it is interfacing with a standard NAND flash storage device of the type it is capable of handling.) The error detection code can be sent before, after, or mixed with data, and, in one embodiment, the error detection code is part of a header (e.g., 8-16 spare bytes) of a data packet that contains the data. As discussed above, the error detection code allows at least one error in the data to be detected but not corrected. Next, the EDC module 450 generates an error detection code based on the data, and the control module 440 compares the generated error detection code with the error detection code received from the host 420 (act 520). Based on this comparison, the control module 440 determines whether the generated error detection code matches the error detection code received from the host 420 (act 530). If the generated error detection code does not match the error detection code received from the host 420, the control module 440 sends a signal to the host 420 indicating that an error occurred in transmission of the data from the host 420 to the controller 400 (act 540). The host 420 can then resend the data to the controller 400. However, if the generated error detection code matches the error detection code received from the host 420, the write process continues with the ECC module 460 generating an error correction code based on the data (act 550). As discussed above, the error correction code allows at least one error in the data to be both detected and corrected. The control module 440 then stores the data and the error correction code in the flash memory device(s) 430 over the second NAND interface 435. Again, the command is issued according to the NAND interface protocol, including command bytes, address bytes, header bytes, and data bytes that contain both the host's data bytes and the corresponding ECC bits generated by the ECC module 460. In this way, the flash memory device(s) 430 are not necessarily even aware that they are receiving information indirectly via the controller 400 and not directly from the host 420.

Turning now in FIG. 6, flow chart 600 illustrates how the controller 400 is used in a read operation. As shown in FIG. 6, the controller 400 receives a read command from the host 420 (act 610). The controller 400 then reads data and an error correction code associated with the data from the flash memory device(s) 430 (act 620). As mentioned above, the error correction code allows at least one error in the data to be both detected and corrected. Next, the ECC module 460 generates an error correction code based on the data, and the control module 440 (e.g., using an ECC correction engine) compares the generated error correction code with the error correction code received from the flash memory device(s) 430 (act 630). Based on that comparison, the control module 440 determines whether the generated error correction code matches the error correction code received from the flash memory device(s) 430 (act 640). If the generated error correction code does not match the error correction code received from the flash memory device(s) 430, the control module 440 attempts to correct the error(s) in the data (act 650). (As discussed above, depending on the ECC scheme used, the control module 440 may be able to correct one or more than one detected error or the control module may use other means to attempt to correct the error.) If the correction does not succeed, a signal can be sent to the host 420 indicating that a storage error occurred. However, if the generated error correction code matches the error correction code received from the flash memory device(s) 430, the read process continues with the EDC module 450 generating an error detection code based on the data (act 660). As discussed above, the error detection code allows at least one error in the data to be detected but not corrected. The control module 440 then sends the data and the error detection code to the host 420 (act 670). The host 420 would then generate its own error detection code based on the data and optional header and compare it to the error detection code received from the controller 420. If the codes do not match, the host 420 would know that a transmission error occurred and can send a signal to the controller 400 to resend the data.

As can be seen from these flow charts 500, 600, this embodiment protects against transmission errors that may occur as data is being sent between the host 420 and the controller 400 over the first NAND interface 425. In some controller architectures, in a write operation, the host generates ECC and sends the ECC and data to the controller, which stores both the ECC and data in the flash memory device. Similarly, in a read operation, the controller retrieves the data and the ECC from the flash memory device and sends the data and the ECC to the host. In these architectures, ECC is not only used to protect against memory device errors, but it is also used to protect against interface transmission errors between the host and the controller. However, in this embodiment, it is the controller 400—not the host 420—that generates ECC to store with data in the flash memory device(s) 430. By having the host 420 generate EDC and having the controller 400 check the EDC on writes and by having the controller 400 generate EDC and having the host 420 check the EDC on reads, this embodiment provide protection against transmission errors over the first NAND interface 425 even though the host 420 does not generate ECC for storage, as in conventional controller architecture. Further, while the process of having the host generate EDC and having the controller check the EDC and then generate ECC is used in some prior controller architectures that provide a non-NAND interface to the host (e.g., USB), this embodiment can be used in controller architectures, such as shown in FIGS. 3 and 4, where the host and the controller communicate over a NAND interface using a NAND protocol. Further, some existing host interface protocols (especially serial ones such as SATA, SAS, FC, and PCIe) provide for some kind of CRC per packet that can be used to detect transmission errors, and this information could be passed thru the host 420 and appended to the data packet and used for a similar purpose. However, data transfers over the external host interface (such as SATA) may have a different transfer length than the pages sent over the first NAND interface 425 to the controller 400, and appropriate adjustments may need to be made.

In the above, the EDC computed by the host 420 and by the EDC module 450 could also be a simpler form of ECC than that used by the ECC module 450. For example, the ECC used over the first NAND interface 425 only needs to detect or correct transmission errors, while the ECC used over the second NAND interface 435 preferably is used to detect and correct NAND storage errors, which may require a longer or more complicated ECC.

Figure 7:
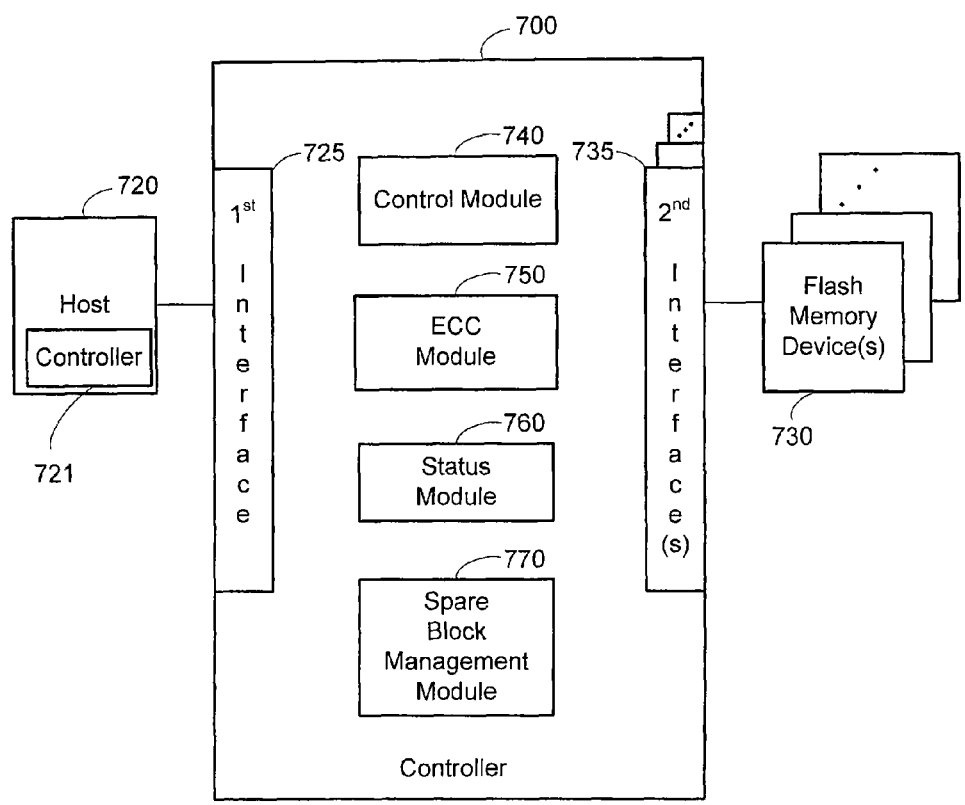
FIG. 7 illustrates a controller arrangement of an embodiment configured for providing read status and spare block management control.

Embodiments Relating to Providing Read Status and Spare Block Management Information in a Flash Memory System Returning to the drawings, FIG. 7 is an illustration of a controller 700 of an embodiment that includes a control module 740, an error correction code (ECC) module 750, a status module 760, and a spare block management module 770. The controller 700 may be in communication with a host 720 (having a host controller 721) and flash memory device(s) 730 via first and second interfaces 725, 735, respectively. The first and second interfaces 725, 735 can take any suitable form, and, in one embodiment, are NAND interfaces, as described above in connection with FIG. 3. However, other, non-NAND-type interfaces can be used, such as, but not limited to, USB and SATA. Additionally, the controller 700 may be placed in any of the physical arrangements discussed above, for example on a separate die that is packaged in a memory system that also contains one or more flash memory dies, independently packaged from the host and the flash memory, and so on.

The control module 740 may be configured for controlling the operation of the controller 700 and performing a memory operation based on a command (e.g., read, write, erase, etc.) and address received from the host 720. An ECC module 750 is used in the process of determining if an error, such as a read or write error, has occurred in handling data retrieved from or sent to blocks of memory in the flash memory. The controller 700 may be configured to apply any of a number of error correction code (ECC) algorithms to detect read errors and to correct for certain detected errors within the capability of the particular error correction code algorithm. The controller 700 handles application of error correction coding such that the host 720 receives data over the first interface 725 processed according to the error correction algorithm rather than having to do error correction at the host. (Alternatively, the ECC module 750 can be replaced with an error handling module that could use other error recovery techniques in addition to or instead of ECC. In such alternative, the controller 700 would still correct the data, so that the data sent over the first interface 725 does not require further error processing by the host 720 (e.g., calculating a single error code or re-reading with a voltage shift).) Conversely, during write operations, the controller 700 handles error encoding data and transfers the ECC code and data over the second interface 735 for storage on the flash memory device(s) 730.

The status module 760 cooperates with the ECC module 750 to provide the host 720 with data relevant to the status of particular operations on the flash memory device(s) 730. For example, the status module 760 may review error analysis activity in the controller 700 and prepare status information on read error information based on whether a read error has been detected, has been corrected, or is uncorrectable. Because of the host, controller, and flash memory arrangement, where the host 720 will typically not be handling the error analysis or correction of data as it is retrieved from the flash memory device(s) 730, the host 720 will have no details of the status of a read operation. The status module 760 allows for this information to be tracked and presented to the host 720 so that the host 720 may make any desired adjustments in how or where data is sent or requested to memory. The host 720 may also use this status to trigger some other proactive or preventative operation, such as wear leveling, data relocation, or read scrubbing.

Figure 8A:
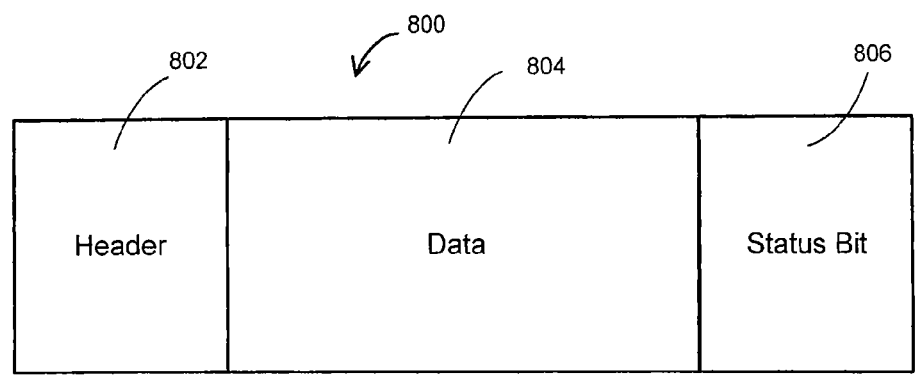
FIGS. 8A, 8B, 8C, and 8D are examples of data message formats that may be generated by the controller of FIG. 7.
Figure 8B:
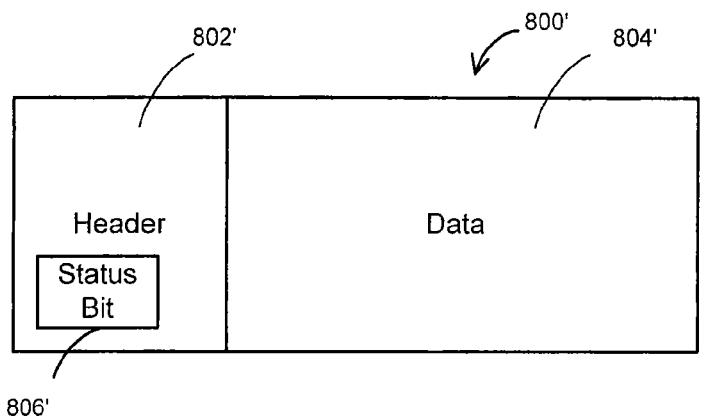
Figure 8C:
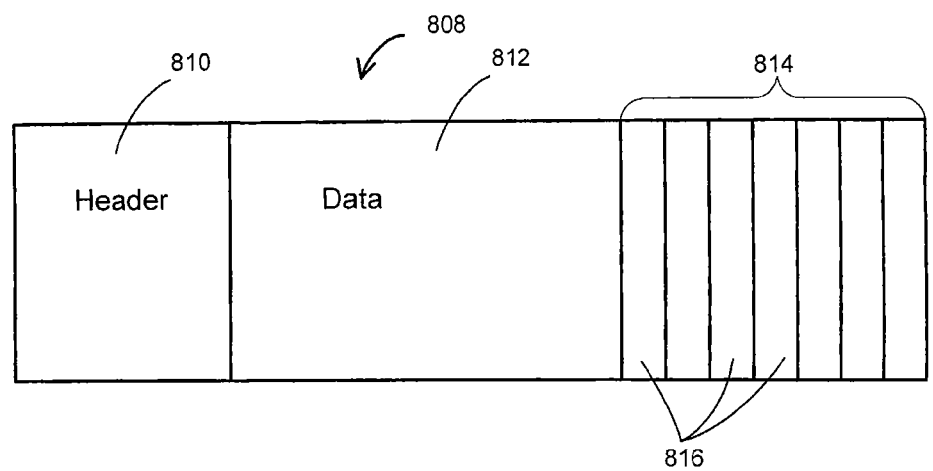

The status module 760 may present status information to the host 720 in one of several formats. In situations where the status module is preparing read status information for transmission to the host 720, the read status may be appended to retrieved data from the flash memory, as indicated in FIGS. 8A and 8C. (It should be noted that the fields shown in these figures can come in any order.) FIG. 8A illustrates a data transfer format 800 where data retrieved from the flash memory, after processing for error analysis by the controller 700, is placed in a message having a header 802, a data payload section 804, and a status bit 806, which can be padded to two or more bytes (accordingly, "bit" as used in the claims, can refer to a single bit or to one or more bits, such as one or more bytes). This status bit 806 may be a binary success or failure indication for use by the host 720. The status bit 806 would not necessarily differentiate between the type or extent of read error, but would provide a flag to the host 720 alerting it that some form of error had been encountered. Alternatively, the status bit may be a single field for carrying an encoded value associated with an error message in a look-up table maintained in the host 720 or by the controller 700. FIG. 8B is similar to FIG. 8A but the status bit 806' is included as part of the header 802' which would normally be filled in by the controller 700 on reads, and there is no separate status bit field.

Figure 8D:
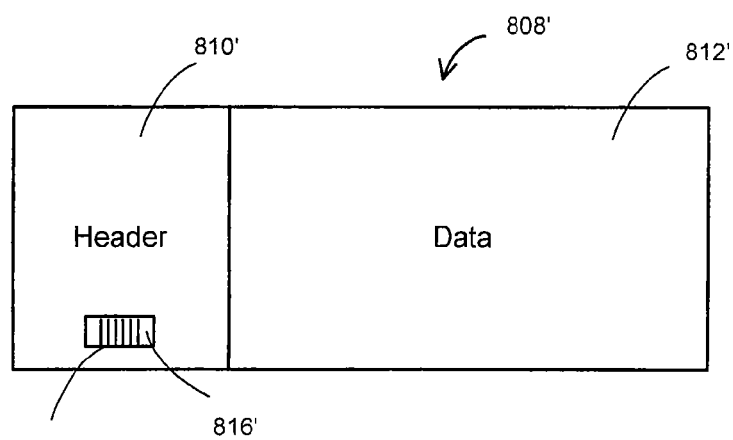

Alternatively, as seen in FIG. 8C, the data transfer format 808 may include a header 810, data payload section 812, and a status section 814 having one or more bits arranged in multiple fields 816 in the status section 814. In the arrangement of FIG. 8C, more detailed information on status may be transferred regarding read errors and will be available for the host 720. In one implementation of the status message, only read error information may be provided to the host 720. In other implementations, the status information may be arranged to convey one or more of read, write, and erase error information detected by the control module 740 and formatted by the status module 760 of the controller 700. In yet other embodiments, fields 816 of the status section 814 may also, or alternatively, present data relating to spare block management. Details on spare block management activities engaged in or reported on by the spare block management module 770 of the controller 700 are provided in the following section. The multiple field embodiment of FIG. 8C provides a mechanism for combinations of errors associated with a memory operation to be reported. FIG. 8D is similar to FIG. 8C but the status field 814' is part of the header 810' and may similarly be composed of multiple fields 816'.

In another embodiment, the result or success/failure of a read could be indicated in the status register or extended status register in one of the reserved or vendor unique fields. However, beyond polling for busy status, host controllers today may not necessarily look for read errors in the status or extended status registers. Program and erase errors are reported over the second interface 735 in response to program or erase commands (this is standard error reporting from a raw NAND device), and this information could be returned to the host. The usual response to such an error is to allocate a new block, copy any current valid data pages from the block with errors, and have any metadata indicate that this is now the valid block and then mark the existing block that has errors as bad. In one embodiment, the controller can indicate the program or erase failures and leave it to the host controller to perform the above copying and metadata management. In another embodiment, the controller can perform these operations and manage the bad block within the controller. In this case, it could be totally transparent to the host controller than an error occurred or the controller could indicate that it took this corrective action (for example, the host could log this like a soft error had occurred). So, in summary, these bits could indicate that an error occurred that the host must manage, that an error occurred that the controller managed (and the host is merely informed), or that the error could be handled by the controller and hidden from the host.

The alternative ways of signaling an error, such as the single status bit 806 or 806', the status section 814 or 814' with multiple fields 816 or 816', or via bits in the status or extended status register, will collectively be referred to as an "error signal." In another embodiment, in addition to one or more of these error signals, the controller 700 may be configured to store detailed status information in a known location in combination with usage of one or more of the error signals. For example, the status module 760 of the controller 700 may store detailed status information (e.g., read status data) in a predetermined location on the flash memory device(s) 730 or in the controller 700 that the host may access in response to receiving one or more of the error signals. Thus, the status bit or field may not convey any more information than a flag indicating that more information is available to the host if the host wants additional details on the status (e.g. a read error). Also, the additional status information flagged by the bit or field may be stored in a location tracked by the controller 700 that the host may access by sending a general command to the controller 700 to retrieve the status information, rather than the host needing to know the location and retrieving the status information.

If the single bit appended status message format of FIG. 8A is used, where the bit is representative of the bare assertion of success or failure of error correction, the bit may be implemented as part of a vendor-specific bit in an extended read format for an available interface protocol, such as ONFI 2.0 available from the Open NAND Flash Interface Working Group. Multiple bit status information, or single or multiple bit information formats, that alerts the host 720 to more detailed information at a location that the status module causes to be stored, may also be used as described above.

Figure 9:
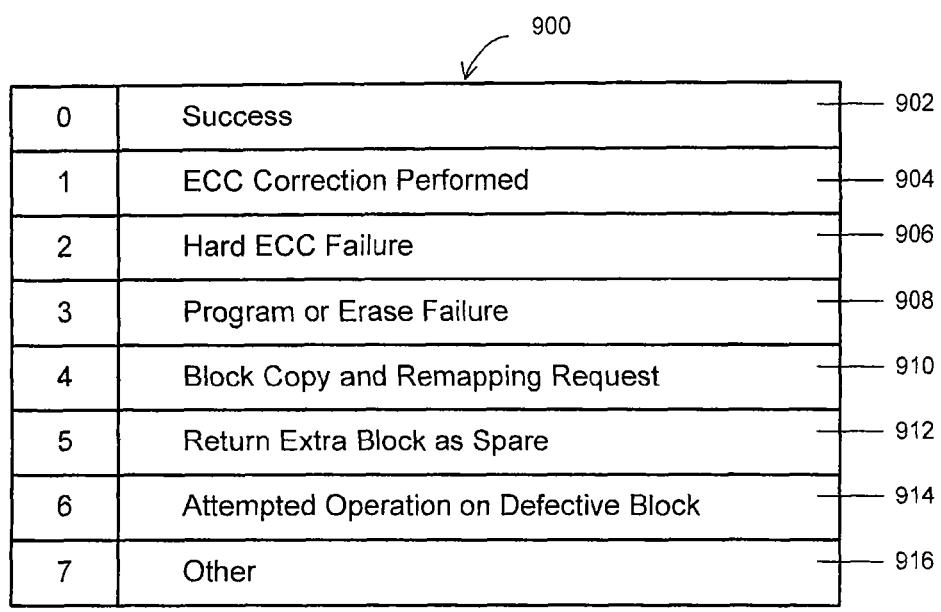
FIG. 9 is an embodiment of data fields available for use in the data message format of FIG. 8C.

FIG. 9 shows one possible arrangement of status fields 900 that may be placed in locations 806, 806', 814, 814' in the embodiments of FIGS. 8A-8D or stored in the controller 700 or flash memory device(s) 730 in the embodiments where the host 720 may request further information after notification of status availability or retrieve the information from the controller 700. The status fields 900 may include a field 902 indicating success or failure of a read operation, a field 904 providing information as to whether a correction such as ECC correction was performed, and a field 906 flagging whether there was a "hard" ECC failure (i.e., where data was lost). In addition to read status information, the status fields 900 may also include one or more fields 908 representing whether a program or erase error was detected by the controller 700. Status information relating to spare block management, as discussed further below, may also be included, such as a field 910 requesting a block copy and remapping, a field 912 asking a host to return a new spare block, and a field 914 indicating to the host 720 that there has been an attempted operation on a defective block in the flash memory device(s) 730. One or more additional fields 916 may be arranged to handle other status information that may be necessary for a particular application. For example, such a field 916 can indicate the number of soft errors (i.e., errors corrected by the ECC).

Figure 10:
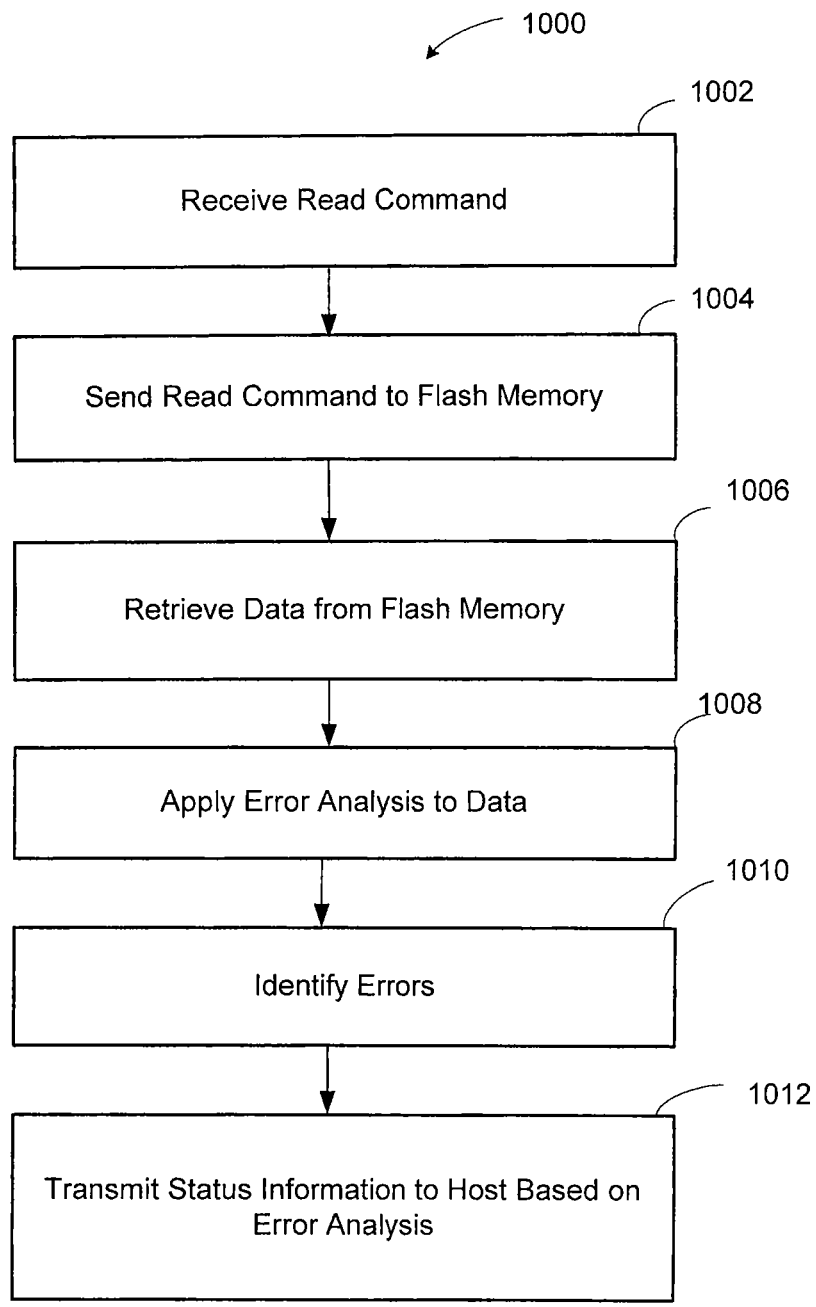
FIG. 10 is a flow chart of a method of an embodiment for providing status information to a host using the controller of FIG. 7.

FIG. 10 illustrates a flow chart 1000 of a method of an embodiment operable on the controller 700 for providing read status information to the host 720. The controller 700 first receives a read command from the host 720 (act 1002). In order to read the data, the controller 700 issues a read command to the flash memory device(s) 730 (act 1004), and the flash memory device(s) 730 return a page of data along with error correction code to the controller 700 over the second interface 735 (act 1006). The ECC module 760 of the controller 700 conducts an error analysis on the retrieved data (act 1008). The error analysis or handling may be an error correction code algorithm or other error correction mechanism. If an ECC algorithm is used, the controller 700 computes the ECC bytes on the retrieved data from the flash memory device(s) 730 and compares the computed ECC bytes with those previously stored and retrieved with the data. If the computed ECC bytes and the retrieved ECC bytes do not match, the controller 700 identifies an error (act 1010). If the difference between the computed ECC and stored ECC is correctable by the controller 700, then the controller 700 will fully correct the data before transfer over the first interface 725 and will identify the error as a "soft" or correctable error. Alternatively, if the error is severe enough that the ECC algorithm or other error recovery procedures cannot compensate for the error, the controller 700 will identify a hard error that signals a data loss has occurred. The corrected data read from flash memory device(s) 730 is then sent over the first interface 725 to the host 720 with the status information appended in a data message format such as one of the data message formats 800, 800', 808, 808' discussed above (act 1012).

With reference to the method of providing a read status error, an embodiment in which is illustrated in FIG. 10, the read status error may be calculated and provided only at the end of each page of information read and analyzed by the controller 700 so that streaming of multiple pages is not interrupted, and it is explicit as to which pages may contain errors. Additionally, in another embodiment, it is contemplated that the controller 700 may read data from the flash memory device(s) 730 and compute the ECC as the data comes in and before a complete page of flash memory has been processed. For example, if the page size is 8 kilobytes (KB), the controller 700 may calculate ECC in 2 KB segments, with each comprising less than a page, so that after each portion of the page is done, the ECC can be checked or corrected for that information representing that part of the page. After one or more 2 KB segments have been transferred from flash memory device(s) 730 to the controller 700, the controller 700 may simultaneously start transferring the error-corrected data over the first interface 725 before the last of the data has transferred for that page from flash memory to the controller.

Good, Bad, and Spare Block Management Embodiments

Referring again to FIG. 9, as mentioned above, the status fields 900 may include information relating to spare block management, for example fields 910-914, useful for handling spare blocks needed to manage bad (defective) blocks that may develop over the useful life of the flash memory. As shown in FIG. 7, a spare block management module 770 may be included in the controller 700 to operate in one of several ways. Depending on the particular spare block management mode adopted, one or more fields of information, such as the example fields 910-914 may be utilized.

In general, flash memory devices are manufactured with an excess number of blocks (greater than the defined minimum capacity). Either during factory testing or during use of the device, certain blocks may be discovered as "bad" or "defective," meaning that they are unable to correctly store data and need to be replaced. Similarly, there may be an excess of "good" blocks (greater than the defined minimum capacity) which may be used as "spares" until another block fails or becomes defective. Keeping track of these extra blocks is known as bad block management and spare block management, respectively. These concepts will be described in more detail in the following paragraphs, which refer to the blocks of an example flash memory device 1200 shown in FIGS. 12A and 12B.

Figure 12B:
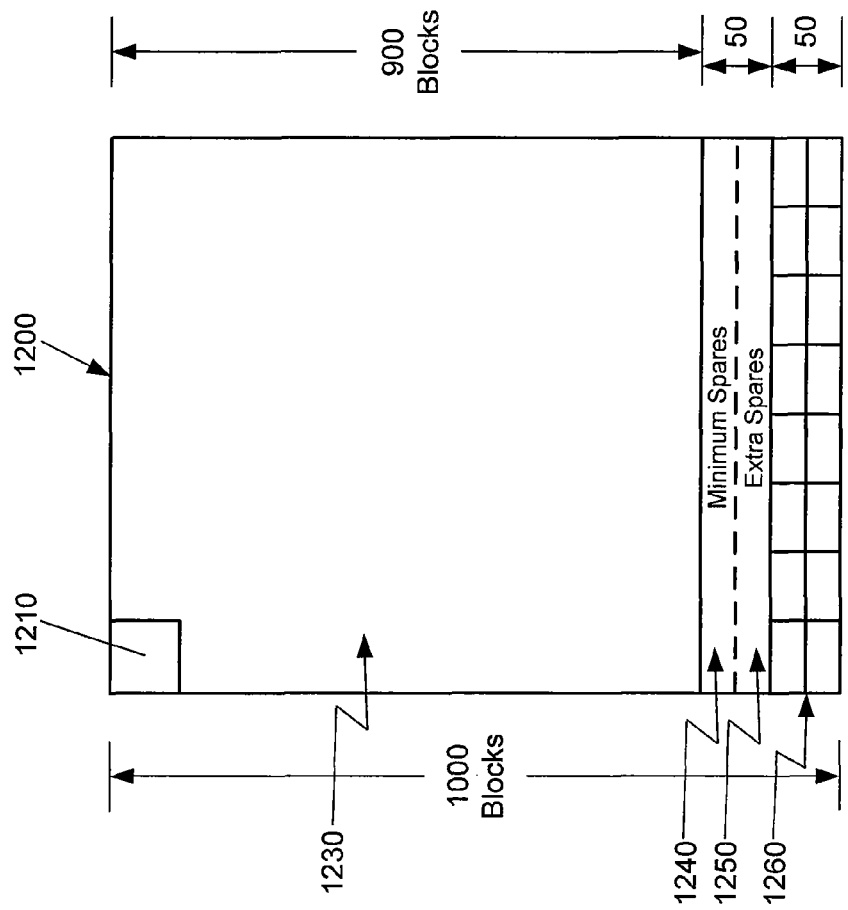
FIGS. 12A and 12B are illustrations of good, bad, and spare block areas within an exemplary flash memory device.
Figure 12A:
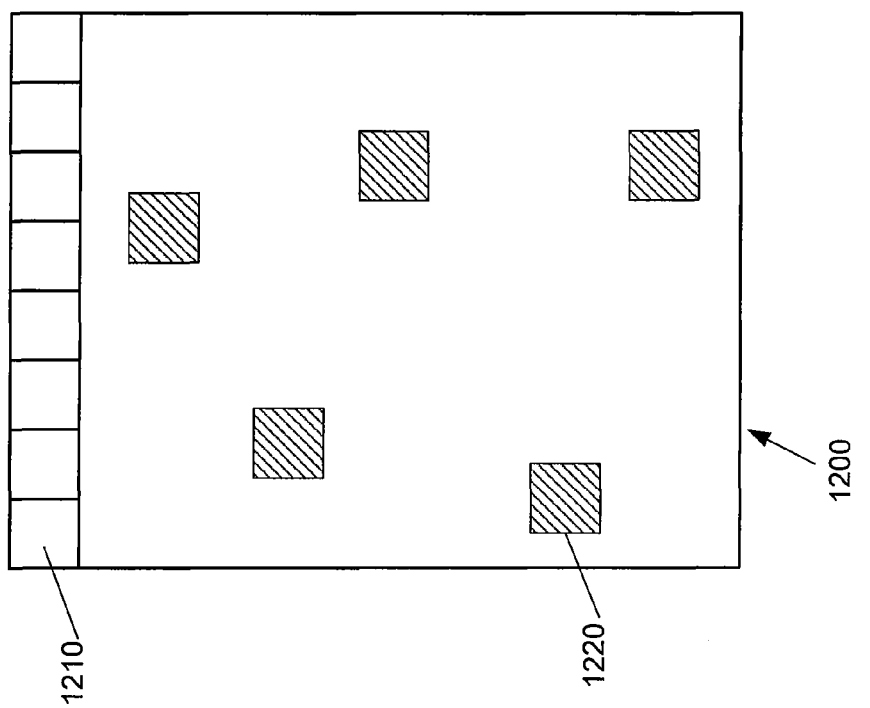

FIG. 12A shows a physical view of the blocks of a device that is designed and fabricated with an example of 1,000 total blocks of memory. In this diagram, the blocks are shown in physical order, and each white block 1210 represents an independent block in the flash memory device (only a few of the 1,000 blocks are shown). Each black block 1220 represents a block that is defective at the time of manufacturing (which are randomly distributed in this example). FIG. 12B shows an abstract view of the same part 1200, where the various good and bad blocks are shown grouped together (and not in physical order). An example vendor data sheet for a part such as 1200 may indicate that it can be relied upon to have at least 900 good blocks at its end of life, as shown in 1230. For our specific exemplary flash memory device 1200, there are 950 good (white) blocks (not all shown) and 50 bad (black) blocks (not all shown). The 50 bad blocks (at time of manufacturing or initial testing) are shown logically grouped together as 1260.

Continuing in our example, the data sheet may also specify that no more than 10 blocks may fail during its specified lifetime, so these are shown as the "minimum spares" 1240. Thus, the device 1200 must have a minimum of 910 good blocks at the time of manufacturing (or the factory would not ship such a device since it would not comply with the data sheet). The other 40 good (white) blocks (the difference between the 950 good blocks and the 910 guaranteed good blocks) are considered "extra spare" blocks and are shown as 1240. The number of extra spares cannot necessarily be relied upon and could theoretically vary between 90 (if there are no bad blocks, although this is very rare) and 0 (implying 90 bad blocks, which would just meet the data sheet requirements). Collectively, the minimum spares and extra spares may also be referred to as the "spare blocks."

Typically, a host would handle spare block management directly with raw flash memory. For example, a standard host may have its own controller that scans all blocks in a flash memory to look for a specific signature to determine which blocks are useable blocks and which blocks are unusable, also referred to as defective or "bad" blocks. Thus, if a flash memory, such as flash memory device(s) 730 described above and as shown in detail in 1200, is manufactured as having 1,000 blocks of memory, the host controller would typically analyze all 1,000 blocks and identify the good and bad blocks. The typical host controller may then use all or a subset of the 940 good blocks (in this example) and reserve 10 blocks as spare blocks for use in replacing currently-usable blocks when the currently-usable blocks go bad. It can also use any extra spare (good) blocks it finds (e.g., 40 in this example). Utilizing a controller 700 with a spare block management module 770 as described in FIG. 7, different aspects of spare block management typically handled by a host may be taken over by the spare block management module 770 of the controller 700.

In one implementation, the spare block management module 770 may be selectively configured to operate in one of three spare block management operation modes: (1) an unmanaged mode wherein the controller 700 provides no management of spare blocks and the host 720 scans blocks for defects on its own; (2) a fully-managed spare block management mode where the controller 700 provides the host 720 with only N good logical blocks, where N is a data sheet parameter and readable in a parameter page available on flash memory; and (3) a split-spare block management mode where the host may use the extra spare blocks but the controller 700 may request a host to release some of these extra blocks for use by the controller 700 when the controller's spare block supply falls below a desired level.

Although the controller 700 may be initialized by the host 720 while still at a manufacturing facility assembling separate host 720, controller 700, and flash memory device(s) 730, or even pre-initialized for use by a specific original equipment manufacturer (OEM), the spare block management module 770 in the controller 700 may be reconfigurable to change the spare block management mode after a different spare block management mode has been selected.

Figure 11:
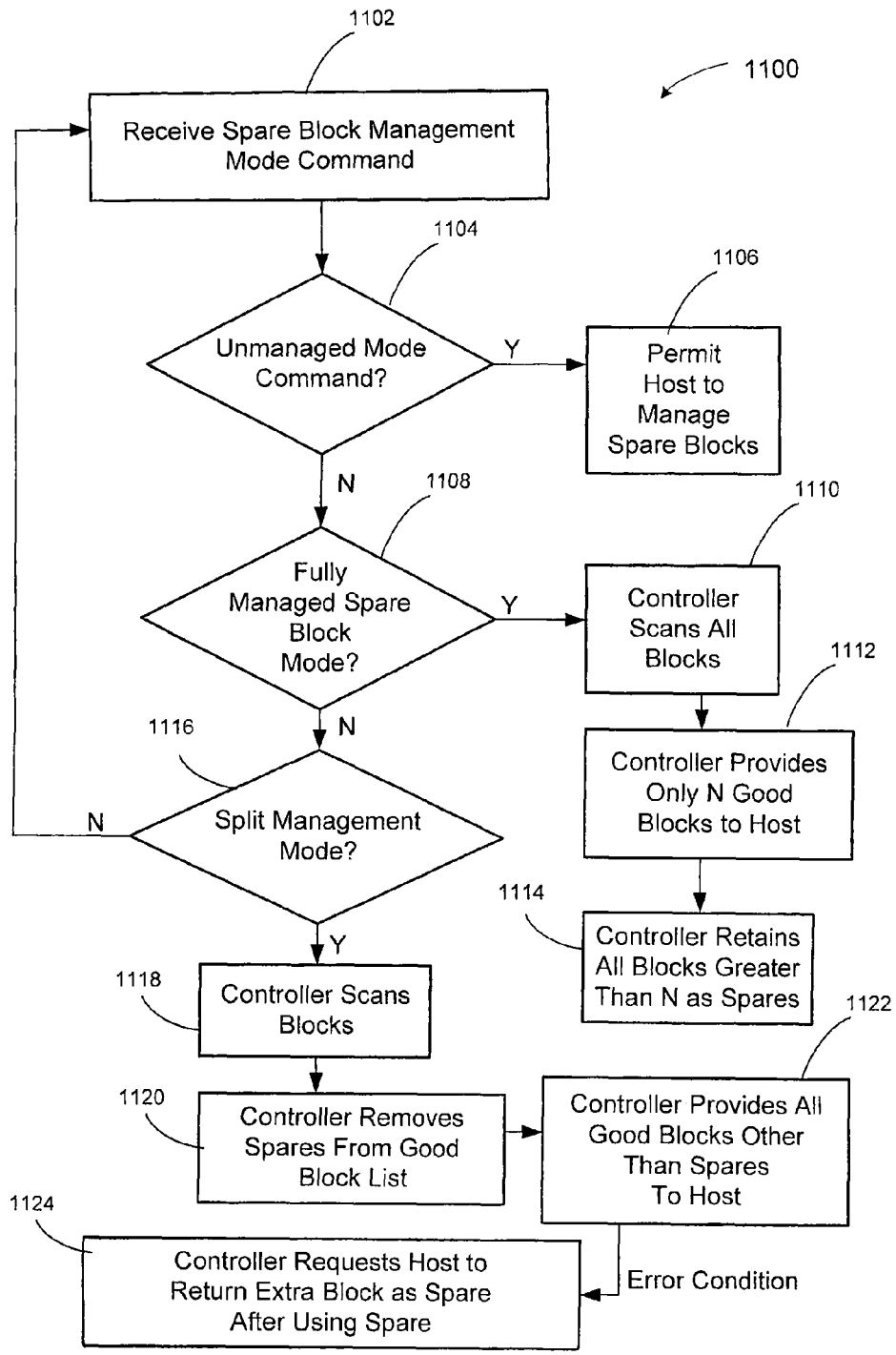
FIG. 11 is a flow chart illustrating one embodiment of managing spare blocks using the controller of FIG. 7.

With reference to the flow chart 1100 of FIG. 11, upon initialization of the spare block management module in the controller 700, either upon original initialization at an OEM or upon resetting a previously-selected mode, the controller 700 receives a selection command identifying a desired mode of operation (act 1102). If the selection command indicates that the unmanaged spare block management mode has been chosen (act 1104), the spare block management module 770 permits the host 720 to directly scan the flash memory device(s) 730 to identify useable and bad blocks (act 1106). In the unmanaged mode, the controller 700 is also prevented from managing spare block usage. Instead, when the spare block management module 770 identifies an error indicative of a bad block (such as an uncorrectable ECC failure (field 906) or a program or erase failure (field 908)), the controller 700 can also inform the host 720 that that particular block needs copying and remapping using an appropriate status field, such as field 910 (FIG. 9). (Field 908 could also be two fields—one for program fail and another for erase fail, or they could be combined in one field.)

Although spare block management may be entirely left up to the host 720 in the unmanaged spare block management mode, the controller 700 may still scan for a few spare blocks and keep those invisible to the host 720 to use for error recovery. In other words, using the example in FIG. 12 of a flash memory having a maximum of a 1,000 blocks, the data sheets could show a minimum guaranteed number of blocks as 900 and a maximum guaranteed number of blocks as 990. If the true number of good blocks in our specific part is 950, the host 720 would only find 940 good blocks if the controller 700 hid 10 blocks for its own use prior to the host 720 scanning for good blocks. The controller 700 may hide good blocks from the host 720 by falsely indicating that the hidden blocks are bad blocks, since the controller 700 knows which blocks it is hiding. For example, if the controller 700 decides to hide block X, then when the host reads block X, it can return arbitrary data along with a defective block flag. Likewise, on any erase or program requests from the host to block X, the controller can signal an erase or program error.

With respect to the second mode of spare block management (act 1108), in the fully-managed mode, the spare block management module 780 performs all scanning of blocks in the flash memory device(s) 730 to identify good blocks and provides only N good blocks to the host controller, where N is a data sheet parameter readable in the parameter page of flash memory of a guaranteed number of usable blocks (acts 1110, 1112). The controller 700 then only allows host operation on the N good blocks. The controller 700 keeps any extra good blocks as spares that it may use for error handling (act 1114). Referring again to the hypothetical flash memory having 1,000 blocks described in FIG. 12 above, N may be 900, where the controller 700 would keep all of the extra 50 useable blocks as spares, and the host 720 has no access to these spares until they are brought into use by the spare block management module 780 in response to a currently-good block going bad.

The third spare block management mode noted above, split management, permits cooperation between the controller 700 and the host 720 as to the use of the extra blocks 1250 (i.e., those above the guaranteed number on the data sheet less any blocks originally reserved as spares). These extra spare blocks can be made available to the host 720 for optimizing host operations. In one embodiment of the split management technique, if the spare block management is initialized with a command for split block management (act 1116), the spare block management module 770 of the controller 700 scans the flash memory device(s) 730 to find good and bad blocks and reserves a few of the good blocks as spare blocks, for example five, for error recovery (act 1118). The controller 700 may discover all the good blocks and only "show" the good blocks to the host.

For example, the controller 700 may read the parameter page of the flash memory device(s) 730 and determine how many remaining good blocks there are in the specific flash memory. The product data sheet for the class of flash memory devices may report the minimum and maximum number of possible good blocks (e.g., 900-990). So, referring again to the example above of a hypothetical flash memory having 1,000 possible blocks where 950 blocks are scanned by the spare block management module 770 and found actually useable, if the controller 700 retains 5 of these good blocks as spare blocks, it would report 945 good blocks to the host 720 (act 1120). Thus, the host 720 would not know that 5 other good blocks exist. The controller 700 may remap the good blocks to a compact logical address range (e.g., addresses of good blocks are sequentially remapped as-is 0-N) with the bad blocks removed (act 1122). If the host 720 attempts a read, program, or erase operation on addresses greater than N, the controller 700 will report an error. Using the data fields 900 of FIG. 9 as an example, this error may be reported by the spare block management module 770 appending data in field 914 so that the host 720 believes it is addressing a defective block when it tries to go outside the controller prescribed range.

In an alternative embodiment of the split management mode, the spare block management module 780 may, instead of scanning all the blocks in flash memory device(s) 730, simply scan and reserve only a set of good blocks to keep as spare blocks for its own and allow the host 720 to scan all the blocks to determine which are good and which are defective. In this alternative implementation of the split management mode, when the host 720 attempts to perform a read, program, or erase operation to one of the blocks that the spare block management module 770 had identified as spare blocks, the controller 700 would either indicate a defect in the block or record an error. For example, the controller 700 may insert a defect flag in the appropriate bytes used to mark defective blocks, or it may populate a field in the read status such as the "attempted operation on a defective block" field 914 in FIG. 9. The host 720 would then use all other usable blocks, including those beyond the number guaranteed in the parameter page, for its purposes.

Regardless of which version of the split block management technique is employed, the host 720 would typically be able to use any extra spare blocks above the minimum for its own benefit, for example to improve performance or endurance, both of which the host 720 could not rely on more than the minimum number of blocks. So, in this example, the host would have 45 extra blocks it could use (950 total useable, minus 5 reserved, vs. 900 guaranteed minimum on data sheet).

With split management mode, when the controller 700 encounters an error that requires a spare block, such as a program or erase error, the spare block management module 770 uses one of its spares to replace the newly-discovered defective block. In this example, the spare would be one of the five blocks reserved as identified above. After using the spare block, the spare block management module 780 would have less than the minimum number of spare blocks (i.e., 5) that it typically maintains and would notify the host 720 that it needs another spare block (act 1124). The notification provided to the host 720 from the spare block management module 780 of the controller 700 may be via a field in the status value returned with retrieved data. For example, in FIG. 9, a flag may be conveyed in field 912 requesting return of an extra block for use as a spare. In this example, the host 720 would need to return one of the 45 extra blocks that it was previously able to use but that exceeded the minimum number it was guaranteed as having access to. The host 720 can indicate to the controller 700 which block is being returned for use as a spare by writing information to a dedicated address or offset with a Set Feature command or by using a vendor-unique command with the block address as its address field.

In the split management mode, the extra blocks above the minimum guaranteed by the data sheet for a class memory would be "split" between extras that the host 720 may use but may be recalled as spares later on and spares that are reserved immediately for the controller 700. This differs from the unmanaged mode where the controller 700 cannot ask for any extra blocks back and has a fixed number of spare blocks that it may use and from the fully-managed mode where all extra blocks are used by the controller 700 and unavailable to the host 720. The flexibility of having full or partial (split) controller-managed mode of spare block management can provide an advantage over typical host management or spare block information by reducing the needed complexity for a host controller.

While specific examples of read status have been described in the examples of FIGS. 7-9, the status module may be used to determine and communicate write (also referred to as "program") or erase errors from controller to host as well using the normal error status bit. In addition, the controller could also optionally use a reserved or vendor-unique field in the error status to indicate that extra status is available. Upon receiving any of these error indicators (read status error, normal write or erase error, or extra status available field), the host could read this extra status information, an example of which is shown in FIG. 9. Bits 2, 3, or 4 in the existing status register fields in ONFI 2.0 could be used to signal the extra status. Additionally, although status information and spare block management are shown as part of the same message format, the controller may be configured to only provide one of status information or spare block management information in other embodiments.

An improved independent controller for use with a flash memory has been described that may handle error analysis and error correction, manage communications relating to spare blocks for error recovery in one of several modes in cooperation with a host, and provides status information regarding read commands or write and erase errors in a message field accessing by the host. The method and controller disclosed herein permit for activity by a controller separate from a host that may allow a host controller to have a more simplified design and permit for customized architecture of a discrete controller that may be used with a host in a flash memory while providing a host with information related to the activities of the controller such that various levels of controller and host cooperation and optimization may be achieved.

Exemplary NAND Flash Memory Controller Embodiment

This section discusses an exemplary controller architecture and provides more details on some of the various functional modules discussed above. As noted above, a "module" can be implemented in any suitable manner, such as with hardware, software/firmware, or a combination thereof, and the functionality of a "module" can be performed by a single component or distributed among several components in the controller.

Figure 13A:
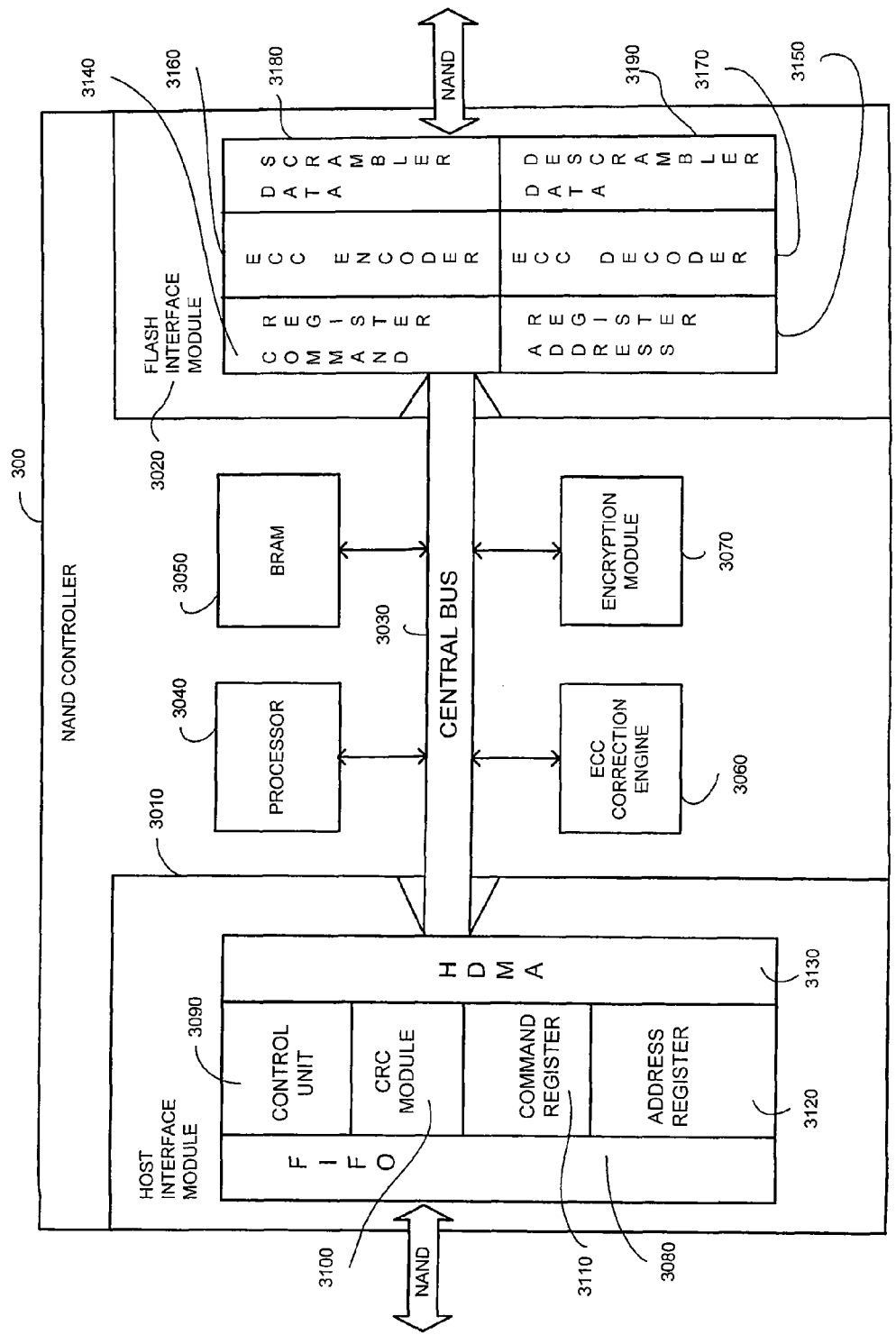
FIGS. 13A-13D are block diagrams of exemplary controllers of an embodiment.

Returning now to the drawings, FIG. 13A is a diagram of a presently preferred implementation of the NAND controller 300 of FIG. 3. It should be understood that any of the components shown in these drawings can be implemented as hardware, software/firmware, or a combination thereof. In this implementation, the first NAND Interface 325 in FIG. 3 is implemented by the Host Interface Module ("HIM") 3010. The HIM 3010 is a collection of logic that supports the "host side interface" as a "flash device-type interface." The HIM 3010 comprises a first-in-first-out ("FIFO") module 3080, a control unit 3090, a cyclic redundancy check ("CRC") module 3100 (although another type of error detection code ("EDC") module can be used), a command register 3110, an address register 3120, and a host direct memory access ("HDMA") unit 3130. In this embodiment, the HIM 3010 takes the form of an ONFI HIM. As will be discussed in more detail below, some HIMs receive a high-level request from a host controller for a relatively-large amount of data that spans several pages, and the NAND controller determines what actions are needed to satisfy the request. In contrast, an ONFI HIM receives several smaller-sized requests (e.g., for individual pages) from a host controller, so the ONFI HIM is required to simultaneously handle multiple (e.g., eight) read and write requests.

Returning to FIG. 13A, the second NAND Interface 335 of FIG. 3 is implemented here by a Flash Interface Module ("FIM") 3020. In a current embodiment, the FIM 3020 is implemented as a collection of logic and a low-level programmable sequencer that creates the "device side interface" as a "host-type interface." In this embodiment, the FIM 3020 comprises a command register 3140, an address register 3150, an ECC encode module 3160, an ECC decode module 3170, a data scrambler 3180, and a data descrambler 3190.

Internal to the NAND controller 300 is a processor 3040, which has local ROM, code RAM, and data RAM. A central bus 3030 connects the processor 3040, the HIM 3010, the FIM 3020, and the other modules described below and is used to transfer data between the different modules shown. This bi-directional bus 3030 may be either an electrical bus with actual connections to each internal component or an Advanced High-Speed Bus ("AHB") used in conjunction with an ARC microprocessor, which logically connects the various modules using an interconnect matrix. The central bus 3030 can transmits data, control signals, or both. The NAND controller 300 also comprises a buffer RAM ("BRAM") 3050 that is used to temporarily store pages of data that are either being read or written, and an ECC correction engine 3060 for correcting errors. The NAND controller 300 further comprises an encryption module 3070 for performing encryption/decryption functions.

The NAND controller 300 can further comprise a column replacement module, which is implemented here by either the FIM sequencer, firmware in the processor 3040, or preferably in a small amount of logic and a table located in the FIM 3020. The column replacement module allows the flash memory device(s) 330 (FIG. 3) to contain information on bad column locations. The bad column address information is contained in the flash memory device(s) 330 and is scanned by firmware prior to any read or write operation. After firmware scans the flash memory device(s) 330, it builds a bad column address table with the bad column location to be used by the column replacement module. On flash write operations, the column replacement module inserts the data (0xFFFF) for the address that is detected in a bad column address table. On flash read operations, data from the bad column address will be discarded.

With the components of the NAND controller 300 now generally described, exemplary write and read operations of the NAND controller 300 will now be presented. Turning first to a write operation, the FIFO 3080 in the HIM 3010 acts as a buffer for an incoming write command, address, and data from a host controller and synchronizes those elements to the system card domain. The CRC module 3100 checks the incoming information to determine if any transmission errors are present. (The CRC module 3100 is an example of the EDC module discussed above.) The CRC module generates or checks an error detection code to check for transmission errors as part of an end-to-end data protection scheme. If no errors are detected, the control unit 3090 decodes the command received from the FIFO 3080 and stores it in the command register 3110, and also stores the address in the address register 3120. The data received from the host controller is sent through the HDMA AHB interface 3130 to the BRAM 3050 via the central bus 3030. The control unit 3090 sends an interrupt to the processor 3040, in response to which the processor 3040 reads the command from the command register 3080 and the address register 3120 and, based on the command, sets up the data path in the FIM 3020 and stores the command in the FIM's command register 3140. The processor 3040 also translates the address from the NAND interface 325 into an internal NAND address and stores it in the FIM's address register 3150. If logical-to-physical address conversion is to be performed, the processor 3040 can use a mapping table to create the correct physical address. The processor 3040 can also perform one or more additional functions described below. The processor 3040 then sets up a data transfer from the BRAM 3050 to the FIM 3020.

The FIM 3020 takes the value from the address register 3150 and formats it in accordance with the standard of the NAND interface 335. The data stored in the BRAM 3050 is sent to the encryption module 3070 for encryption and is then sent through the data scrambler 3180. The data scrambler 3180 scrambles the data and outputs the data to the FIM's ECC encoder 3160, which generates the ECC parity bits to be stored with the data. The data and ECC bits are then transferred over the second NAND interface with the write command to the flash memory device(s) for storage. As an example of an additional function that may occur during writes, if protection for write aborts or program failures is enabled and if the write request is to an upper page address, the processor 3040 can send a read command to the flash memory device(s) over the second NAND interface for the corresponding lower page and then send a program command to have it copied into a safe zone (a spare scratchpad area) by writing it back to another location in the flash memory device(s) 330. If an error occurs in writing the upper page, the lower page can still be read back from the safe zone and the error corrected. (This is an example of the module discussed above for handling write aborts and/or program failures via safe zones.)

Turning now to a read operation, the HIM 3010 receives a read command from a host controller, and the processor 3040 reads the command and logical address. If logical-to-physical address conversion is to be performed, the firmware in the processor 3040 could use a mapping table to create the correct physical address. (This is an example of the address mapping module discussed above.) The firmware then sends the physical address over the second NAND interface 335 to the flash memory device(s) 330. After the read access, the data is transferred over the NAND interface, decoded and used to generate the syndrome data for error correction, descrambled by the data descrambler 3190, and then sent over the central bus 3030 to the BRAM 3050. The ECC correction engine 3060 is used to correct any errors that can be corrected using the ECC on the data that is stored in the BRAM 3050. Since the ECC may be computed and stored in portions of a physical page, the processor 3040 can be interrupted as each portion of the page is received or corrected, or once when all of the data is transferred. The encryption module 3070 then performs a decryption operation on the data. The timing described above is flexible since the first NAND interface 325 and the second NAND interface 335 may operate at different speeds, and the firmware can transfer the data using either store-and-forward techniques or speed-match buffering. When the data is sent back to the host controller, it is sent through the HIM 3010, and the transmission CRC is sent back to the host over the first NAND interface 325 to check for transmission error.

As mentioned above, in addition to handling commands sent from the host controller, the processor 3040 may perform one or more additional functions asynchronously or independent of any specific command sent by the host. For example, if the ECC correction engine 3060 detects a correctable soft error, the ECC correction engine 3060 can correct the soft error and also interrupt the processor 3040 to log the page location so that the corresponding block could be read scrubbed at a later point in time. Other exemplary background tasks that can be performed by the processor 3040 are wear leveling and mapping of bad blocks and spare blocks, as described below.

Figure 13B:
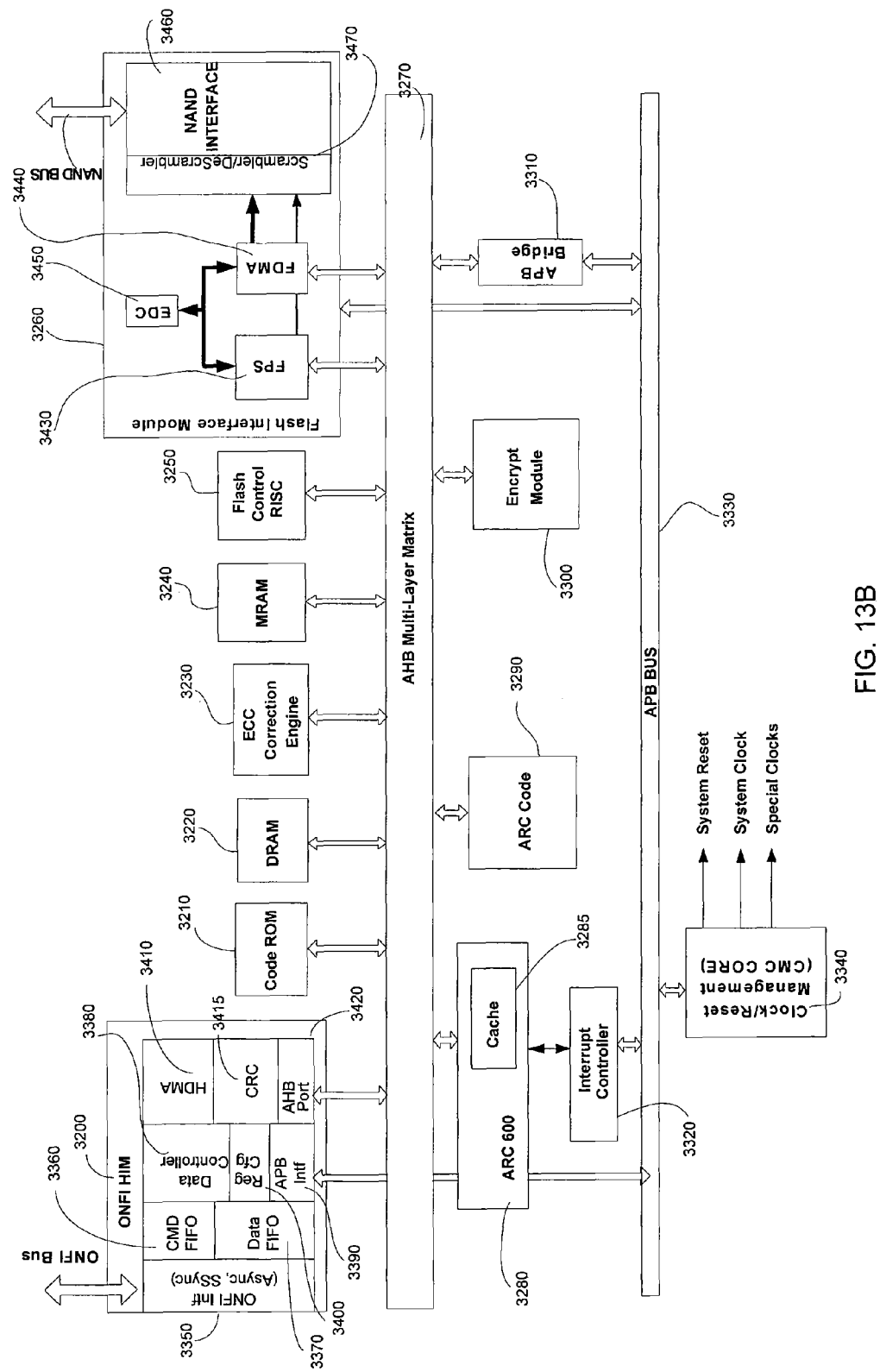

Turning again to the drawings, FIG. 13B is a block diagram showing a more detailed view of a NAND controller of an embodiment. As with the controller shown in FIG. 13A, the controller in this embodiment contains an ONFI HIM 3200 and a FIM 3260 that communicate through a central bus (here, an Advanced Microcontroller Bus Architecture ("AMBA") High-performance Bus ("AHB") multi-layer matrix bus 3270 for the data path and an advanced peripheral bus ("APB") 3330 for the command path). The ONFI HIM 3200 and the FIM 3260 can be associated with any of the processors. For example, the ONFI HIM 3200 can be associated with an ARC600 microprocessor 3280 (with a built-in cache 3285)

that runs ARC code stored in a MRAM 3290. In general, the ARC600 3280 is used to service interrupts from the ONFI HIM 3200 and manages the data path setup and transfers information to the flash control RISC 3250. The flash control RISC 3250 is the microprocessor that can be used with the FIM 3260 and, in general, handles the function of setting up the FIM 3260 by generating micro-control codes to various components in the FIM 3260. More particularly, the flash control RISC 3250 sets up the flash direct memory access ("FDMA") module 3440 in the FIM 3260, which communicates with the AHB bus 3270 and generates the AHB bus protocol commands to read data from the DRAM 3220. The flash control RISC 3250 also sets up the EDC module 3450, which contains the ECC encoder and decoder. The MRAM 3240 stores code used to run the flash control RISC 3250.

The NAND controller in this embodiment also contains a ROM 3210 that stores instruction code to get the controller running upon boot-up. Additional components of the NAND controller include a DRAM 3220, an ECC correction engine 3230, an encrypt module 3300, an APB bridge 3310, an interrupt controller 3320, and a clock/reset management module 3340.

The encryption module 3300 enciphers and deciphers 128 bit blocks of data using either a 128, 192, or 256 bit key according to the Advanced Encryption Standard (AES). For write operations, after data is received from the host and sent to the BRAM 3050 (FIG. 13A) by the ONFI HIM, the ARC600 processor 3280 creates a control block with defined parameters of the encipher operations. The encryption module 3300 then performs the encipher operations and stores the resulting data to BRAM 3050 and interrupts the ARC600 processor 3280 to indicate that the data is ready. For read operations, after the ECC engine completes error correction in the BRAM 3050, the ARC600 processor 3280 creates a control block with defined parameters of the decipher operations. The encryption module 3300 then performs the decipher operations and stores the resulting data to the BRAM 3050 and interrupts the ARC600 processor 3280 to indicate data is ready.

Turning now to the ONFI HIM 3220 and the FIM 3260 in more detail, the ONFI HIM 3220 comprises an ONFI interface 3350 that operates either in an asynchronous mode or a source synchronous mode, which is part of the ONFI standard. (Asynchronous (or "async") mode is when data is latched with the WE# signal for writes and the RE# signal for reads. Source synchronous (or "source src) sync") is when the strobe (DQS) is forwarded with the data to indicate when the data should be latched.) The ONFI HIM 3200 also contains a command FIFO 3360, a data FIFO 3370, a data controller 3380, a register configuration module 3400, a host direct memory access ("HDMA") module 3380, and a CRC module 3415, which function as described above in conjunction with FIG. 13A. The ONFI HIM 3200 further contains an APB interface 3390 and an AHB port 3420 for communicating with the APB bus 3330 and the AHB bus 3270, respectively. The FIM 3260 comprises an EDC module 3450 that includes an EDC encoder and an EDC decoder, a flash protocol sequencer ("FPS") 3430, which generates commands to the NAND bus based on micro-control codes provided by the flash control RISC 3250 or the ARC600 microprocessor 3280, an FDMA 3440, a data scrambler/de-scrambler 3470 and a NAND interface 3460.

The scrambler/descrambler 3470 performs a transformation of data during both flash write transfers (scrambling) and flash read transfers (de-scrambling). The data stored in the flash memory device(s) 330 may be scrambled in order to reduce data pattern-dependent sensitivities, disturbance effects, or errors by creating more randomized data patterns. By scrambling the data in a shifting pattern across pages in the memory device(s) 330, the reliability of the memory can be improved significantly. The scrambler/descrambler 3470 processes data on-the-fly and is configured by either the ARC600 processor 3280 or the Flash Control RISC 3250 using register accesses. ECC check bit generation is performed after scrambling. ECC error detection is performed prior to de-scrambling, but correction is performed after descrambling.

The NAND controller in this embodiment processes write and read operations generally as described above with respect to FIG. 13A. For example, for a write operation, the command FIFO 3360 and the data FIFO 3370 store an incoming write command and data, and the CRC module 3415 checks the incoming information to determine if any transmission errors are present. If no errors are detected, the data controller 3380 decodes the command received from the command FIFO 3360 and stores it in a command register in the register configuration module 3400. The address received from the host controller is stored in the address register in the register configuration module 3400. The data received from the host controller is sent through the HDMA 3410 to the DRAM 3220. The data controller 3380 then sends an interrupt to the ARC600 3280 or the Flash Control RISC 3250, which reads the command from the command register, reads the address from the address register, and passes control to the flash control RISC 3250 to set up the FIM 3260 to start reading the data from DRAM 322 and perform ECC and data scrambling operations, the result of which is sent to the flash memory device(s) 330 for storage. The ARC600 microprocessor 3280 and/or the FIM 3260 can perform additional operations. For example, the FIM 3260 can perform column replacement, and the following operations can be performed using the ARC600 microprocessor 3280 together with the FIM 360: bad block and spare block management, safe zones, read scrubbing, and wear leveling. These operations are described in more detail below.

For a read operation, the ONFI HIM 3200 sends an interrupt to the ARC600 microprocessor 3280 when a read command is received. The ARC600 microprocessor 3280 then passes the command and address information to the flash control RISC 3250, which sets up the FPS 3430 to generate a read command to the NAND flash memory device(s) 330. Once the data is ready to be read from the NAND flash memory device(s) 330, the FPS 3430 starts sending read commands to the NAND bus. The read data goes through the NAND interface unit 3460 to the data descrambler 3470 and then through the EDC module 3450, which generates the syndrome bits for ECC correction. The data and syndrome bits are then passed through the FDMA 3440 and stored in the DRAM 3220. The flash control RISC 3250 then sets up the ECC correction engine 3230 to correct any errors. The encrypt module 3300 can decrypt the data at this time. The ARC600 microprocessor 3280 then receives an interrupt and programs the register configuration module 3400 in the ONFI HIM 3200 to state that the data is ready to be read from the DRAM 3220. Based on this information, the ONFI HIM 3200 reads the data from the DRAM 3220 and stores it in the data FIFO 3370. The ONFI HIM 3200 then sends a ready signal to the host controller to signal that the data is ready to be read.

As mentioned above, unlike other HIMs, an ONFI HIM receives several smaller-sized requests (e.g., for individual pages) from a host controller, so the ONFI HIM is required to simultaneously handle multiple (e.g., eight) read and write requests. In this way, there is more bi-directional communication between the ONFI HIM and the host controller than with other HIMs. Along with this increased frequency in communication comes more parallel processing to handle the multiple read and write requests.

Figure 13C:
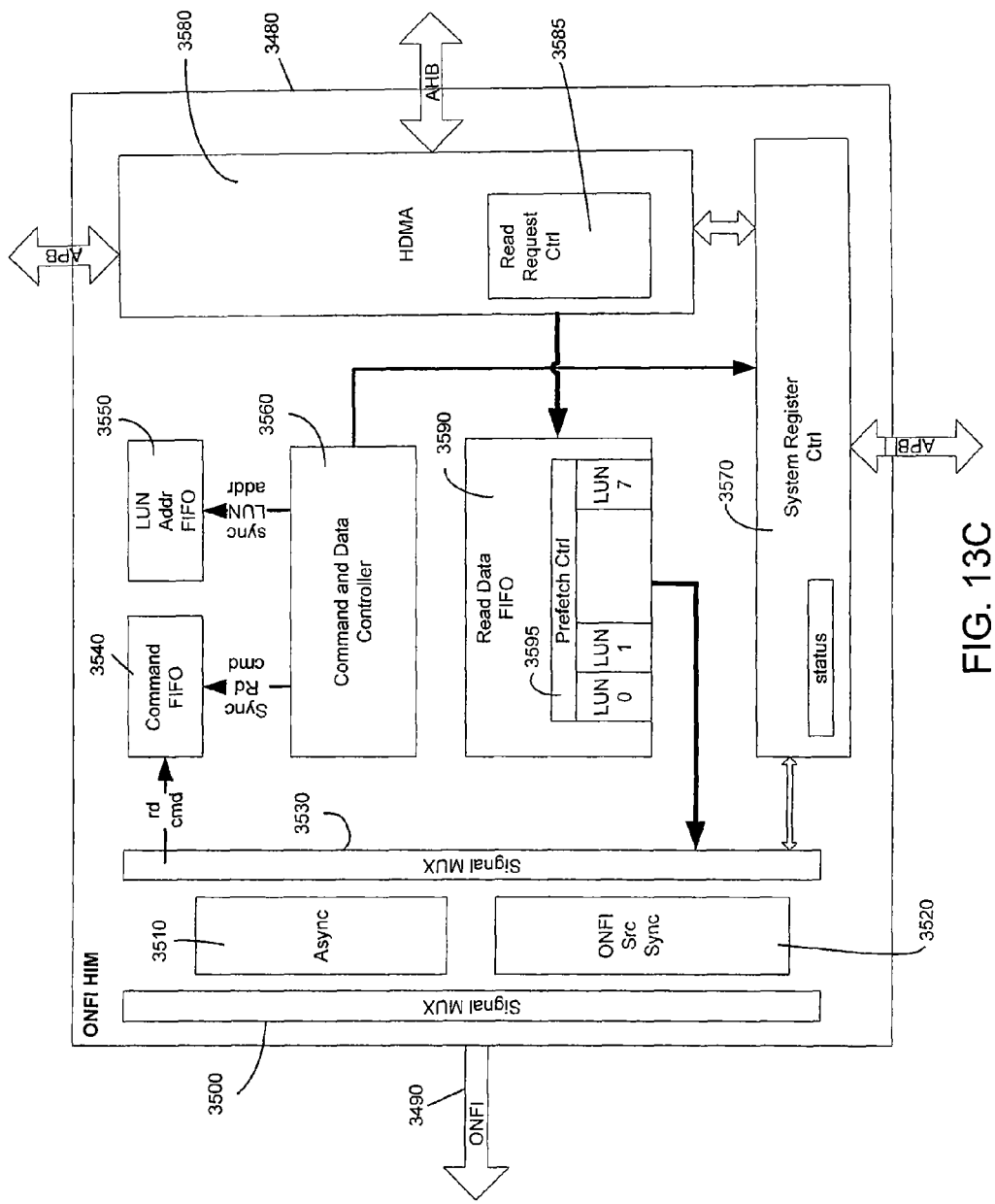
Figure 13D:
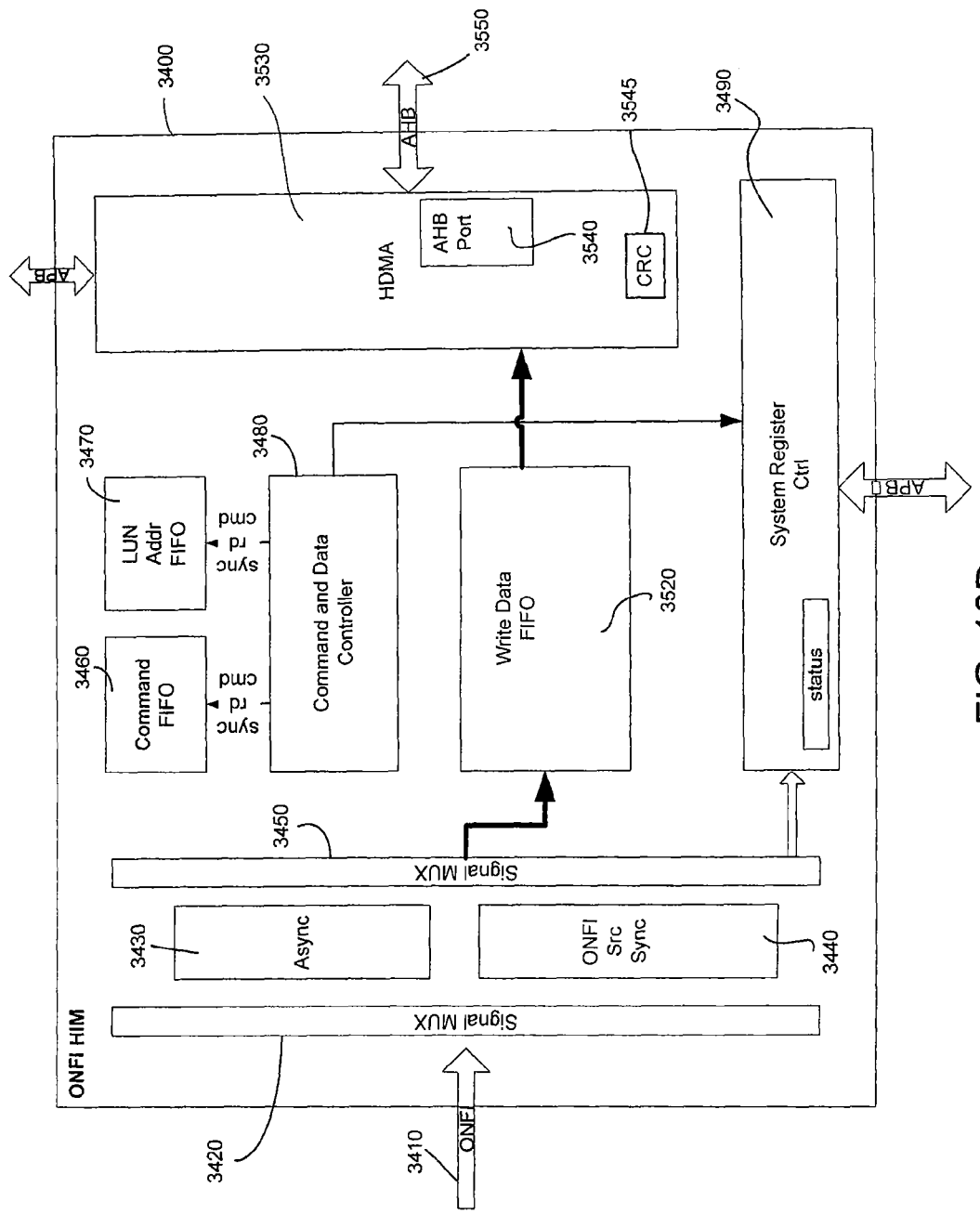

FIGS. 13C and 13D illustrate the logical operations of an ONFI HIM for read and write operations, respectively. Turning first to FIG. 13C, the ONFI HIM 3480 of this embodiment receives a read command from a host controller through an ONFI bus 3490. The ONFI HIM 3480 can operate in an asynch or a source synch mode and communicates the read command to a command FIFO 3540 via signal multiplexors 3500, 3530. (The ONFI HIM 3480 can be used in an async mode and source sync mode using the Async and ONFI source sync components 3510, 3520, respectively.) The ONFI HIM 3480 also stores the address received from the host controller in a logical unit number ("LUN") address FIFO 3550. (The NAND controller in this embodiment supports multiple logical units, which are treated as independent entities that are addressable by LUN addresses.) The command and address are read from the FIFOs 3540, 3550 into a command and data controller 3560, which synchronizes these items. The command and data controller 3560 then sends an interrupt to the system register controller 3570, which generates an interrupt to the ARC600 microcontroller. The ARC600 microcontroller then reads the LUN address from the register in the system register controller 3570, and the process of reading data from the flash memory device(s) is as described above. When all the read data is written to the DRAM, the ARC600 microprocessor program the status register in the system register controller 3570 to inform the ONFI HIM 3480 that the data is ready to be read. The ONFI HIM 3480 then reads the data through the HDMA 3580 using the read request control unit 3585. The read data is stored in the read data FIFO 3590, which is partitioned for each LUN 3595. Once that is done, a ready indicator is stored in the status register, and the data is streamed to the host controller.

Turning now to FIG. 13D, in a write operation, a write command is received from a host controller through an ONFI 3410 bus. The ONFI HIM 3400 communicates the write command to a command FIFO 3460 via signal multiplexors 3420, 3450. (The ONFI HIM 3400 can be used in an async mode and source sync mode using the Async and ONFI source sync components 3430, 3440, respectively.) The ONFI HIM 3400 also stores the address received from the host controller in a logical unit number ("LUN") address FIFO 3470. The data received from the host controller is stored in a write data FIFO 3520. The command and address are read from the FIFOs 3460, 3470 into a command and data controller 3480, which synchronizes these items. The command and data controller 3480 then sends an interrupt to the system register controller 3490, which generates an interrupt to the ARC600 microcontroller. The ARC600 microcontroller then reads the LUN address from the register in the system register controller 3490, and the process of setting-up the controller from a write operation is as described above. The HDMA 3530 has an AHB port 3540 in communication with the AHB bus 3550 and sends the data to the DRAM. The CRC module 3545 checks for transmission errors in the data. Once the data has been stored in the flash memory device(s) 330 and the flash memory device(s) 330 indicate ready and the status of program operation is successful or fail, a ready indicator is stored in the status register in the system register controller 3490, indicating that the ONFI HIM 3400 is ready for another command from the host controller.

Returning to FIG. 13A, the NAND controller 300 can also handle program failures and erase failures. As the NAND flash memory device(s) 330 attached to the flash interface module 3020 (hereafter FIM) are programmed, the NAND memory device(s) 330 report the success or failure of the program operation to the NAND controller 300 (or optionally to the ONFI Host through the host interface module 3010 (hereafter HIM)). The NAND memory device(s) 330 may experience some number of program failures over the expected life of the memory due to defects in the NAND cells or due to the limited endurance the NAND cells have with regard to erase and program cycles.

The NAND memory device(s) 330 will return a FAIL status to the controller 300 when the program page operation does not complete successfully. The controller processor 3040 (FIG. 13A) or flash protocol sequencer 3430 (FIG. 13B) verifies the success or failure of each program page operation. Generally, the failure of any single program page operation will cause the processor 3040 (or optionally the ONFI Host) to regard the entire NAND block (which may contain multiple pages) to be defective. The defective block will be retired from use. Typically, the controller 300 will copy the data that was not successfully programmed and any data in preceding pages in the defective block to another replacement block (a spare block). The controller 300 may read preceding pages into the BRAM 3050 using the FIM 3020, the data de-scrambler 3190, and the ECC decoder 3170 and applying ECC correction as needed. The data is then written to the replacement block using the FIM 3020 in the normal fashion.

One aspect of program failures is that a failure programming one page may corrupt data in another page that was previously programmed. Typically, this would be possible with MLC NAND memory which is organized physically with upper and lower logical pages sharing a word-line within the memory array. A typical usage would be to program data into a lower page and subsequent data into the upper page. One method to prevent the loss of data in the lower page when a program failure occurs when programming the upper page on the word-line is to read the lower page data prior to programming the upper page. The lower page data could be read into the controller BRAM 3050 and could additionally be programmed into a scratch pad area in the non-volatile flash memory device(s) 330, sometimes called a "safe zone." The data thus retained in the BRAM 3050 or safe zone would then be protected from loss due to a programming failure and would be available to be copied to the replacement block, particularly in cases where the data was corrupted in the lower page of the NAND memory device(s) 330 and could no longer be read successfully.

It is possible that some NAND failure modes could similarly corrupt data in other areas of the memory array, such as on adjacent word lines. This method of reading other potentially vulnerable data into the controller BRAM 3050, and/or saving the data into a scratch pad or safe zone area could also be used to protect data in these circumstances.

As the NAND flash memory device(s) 330 attached to the FIM 3020 are erased, the NAND memory device(s) 330 report the success or failure of the block erase operation to the NAND controller 300 (or optionally to the ONFI Host through the HIM 3010). The NAND memory device(s) 330 will return a FAIL status to the controller 300 when the erase operation does not successfully complete. The controller processor 3040 or circuits in the flash protocol sequencer 3430 verifies the success or failure of each erase operation. Generally, the failure of any erase operation will cause the processor 3040 (or ONFI Host) to regard the entire NAND block to be defective. The defective block will be retired from use and a spare block used in its place.

The NAND controller 300 can also handle program disturbs, erase disturbs, and read disturbs within the flash memory device.

The internal NAND programming operations could possibly effect, or disturb, other areas of the memory array, causing errors when attempting to read those other areas. One method to prevent failures from program disturb is to perform reads or "read scrubbing" operations on potentially vulnerable areas in conjunction with programming operations, in order to detect disturb effects before they become uncorrectable or unrecoverable errors. Once a disturb condition is detected (by high soft error rates during the read scrubbing operation), the controller processor 3040 (or the external ONFI host) can copy the data to another area in the flash memory device(s) 330.

The internal NAND erase operations could possibly effect, or disturb other areas of the memory array, causing errors when attempting to read those other areas. One method to prevent failures from erase disturb is to perform reads or "read scrubbing" operations on potentially vulnerable areas in conjunction with erase operations, in order to detect disturb effects before they become uncorrectable or unrecoverable errors. Once a disturb condition is detected, the controller processor 3040 (or the external ONFI host) can copy the data to another area in the flash memory device(s) 330.

The internal NAND read operations could possibly effect, or disturb other areas of the memory array, causing errors when attempting to read those other areas. The disturb effects can sometimes accumulate over many read operations. One method to prevent failures from program disturb is to perform reads or "read scrubbing" operations on potentially vulnerable areas in conjunction with read operations, in order to detect disturb effects before they become uncorrectable or unrecoverable errors. Once a disturb condition is detected, the controller processor 3040 (or the external ONFI host) can copy the data to another area in the flash memory device(s) 330.

Referring now to FIG. 13A, the NAND controller 300 handles read errors in the following manner. Typically, the data that is programmed into the NAND memory device(s) 330 through the FIM 3020 has an error detection or error correction code appended and stored with the data in the NAND array. The controller 300 uses the ECC encoder 3160 for this function. When such data is read from the flash array to the BRAM 3050, the ECC decoder 3170 re-generates the ECC code from the data and compares it to the ECC code that was appended to the data when programmed into the flash. If the data is identical to the data that was written, the ECC circuits indicate that there is no data error present. If some difference in the read data is detected, and the difference is small enough to be within the capability of the ECC to correct, the read data (typically contained in the BRAM 3050) is "corrected" or modified to restore it to the original value by the ECC correction engine 3060, as controlled by the processor 3040. If the data errors exceed the ECC correction capability, an "uncorrectable" read error occurs. Typically, an uncorrectable read error would result in an error status being returned to the Host interface when read.

One method to prevent uncorrectable read errors, or to recover when an error is detected, is for the controller 300 (or the external ONFI host) to retry the read operation. The retry may use shifted margin levels or other mechanisms to decrease the errors within the data, perhaps eliminating the errors or reducing the number of errors to a level that is within the ECC correction capability.

Optionally, when a read error is recovered, or if the amount of ECC correction needed to recover the data meets or exceeds some threshold, the data could be re-written to the same or to another block in order to restore the data to an error-free or improved condition. The original data location may optionally be considered as defective, in which case it could be marked as defective and retired from use.

Referring again to FIG. 13A, the NAND controller 300 can also handle write aborts. Write aborts are the unexpected loss of power to the controller 300 and NAND memory device(s) 330 while a program or erase operation is in progress. The loss of power can result in incomplete programming or erase conditions in the NAND memory device(s) 330 that could result in uncorrectable read errors. In some cases, such as with MLC NAND, other pages that share a word line (i.e., a lower page) could be corrupted by an aborted program operation on the upper page of a word line, much like the program failure condition described above.

There are several methods to reduce or eliminate write abort errors, or minimize their impact. One method is to use a low voltage detection circuit to notify the processor 3040 that the power has been interrupted. The processor 3040 can then allow current program or erase operations to finish but not allow new operations to start. Ideally, the current operations would have enough time with sufficient power to complete.

An alternative method, perhaps used in conjunction with the low voltage detection method, is to add capacitance or a battery (or some alternative power supply source) to the power supply circuits to extend the power available to complete program or erase operations.

Another method is to provide a scratch pad "safe zone" similar to that described above. Any "old" data that exists in lower pages that may be vulnerable during an upper page program could be read and saved in the safe zone before the upper page program is started. That would provide protection for previously-programmed data in case of a power loss event. In some implementations, it may be acceptable to not be able to read data that was corrupted in a write abort situation, but other possibly un-related older data must be protected.

Another method is to search for potential write abort errors when the controller is powered on. If an error is found that can be determined (or assumed) to be a result of a write abort, the error data may be discarded. In this situation, the controller 300 effectively reverts back to previous data, and the interrupted operation is as if it did not happen.

Referring again to FIG. 13A, the NAND controller 300 can also conduct wear leveling on the memory. Wear leveling is a method to increase overall product endurance and lifetime by more evenly distributing block usage amongst all physical blocks than would otherwise occur as a result of normal flash management algorithms. This is done by forcing "cold" blocks to the spare blocks pool, which will in turn be used for host data updates, and, at the same time, moving the data from "cold" blocks, which are not updated by the host, to a "hot" block. This swap will result in mixing up "hot" and "cold" blocks. The swap can be done either randomly or cyclically, choosing blocks for the swap, or choosing them on the basis of a hot count (number of program-erase cycles) analysis. The swap can be done periodically, say in every 100 block cycles, typically calibrated by a system parameter to balance between overall system performance and evening of block usage to balance wear and performance overhead.

An example high level sequence is:
1. Schedule wear leveling operation
2. Identify "hot" and "cold" blocks by either hot count analysis or on random or cyclic basis.
3. Copy data from the selected "cold" block to the selected "hot" free block in the free block pool.
4. Release the "cold" block to the free block pool. As a result, the free block pool is populated by a cold block instead of hot one.

Some operations can be skipped, like analysis-based blocks selection. The wear level operation itself can also be skipped if block wear distribution is detected as even.

The wear level operations and hot count management are performed in firmware by the processor 3040, such that the host controller 121 (FIG. 3) will not be aware of these housekeeping flash block level operations Referring to FIG. 13A, the controller 300 can also implement read scrubbing on the flash memory device(s) 330 upon detection of a read disturb. Read operations to one area of the NAND memory array within the flash memory device(s) 330 may affect or disturb other areas of the memory array, causing cells to shift from one state to another, and ultimately causing bit errors when attempting to read data previously stored to those other areas. The disturb effects can accumulate over many read operations, eventually leading to a number of bit errors that may exceed the data correction capabilities of the system. The errors that exceed the system correction capabilities are referred to as uncorrectable errors. One method to prevent failures from program disturbs is to perform reads or "scrubbing" operations on potentially vulnerable areas, in order to detect disturb effects before they become uncorrectable or unrecoverable errors. Once a disturb condition is detected, typically by detecting that there are a number of bits in error on the data read, the processor 3040 can move the data to another area in the memory generally by copying the data to another area of the NAND memory array in order to "refresh" it.

Read scrub copy is usually triggered by correctable ECC error discovered by the ECC correction engine 3060 (FIG. 13A), either in blocks read during the course of a host read operation, an internal system read operation, or by a scheduled read scrub scan. System read operations are those needed by the flash storage system to read firmware, parameters, or mapping information stored in the NAND flash. Read scrub scan is a read of all data in a block to determine whether any data contained therein has been disturbed. Blocks are selected for a read scrub scan typically when they have been partially read during the course of a host read or system read operation, but may also be selected using other criteria, such as randomly, or via deterministic sequencing through the blocks of memory. Because a read scrub scan operation takes time and affects data throughput of the system, the system may select blocks for read scrub scan only periodically or infrequently, by use of a random selection, a counter, or other mechanisms. The frequency of scheduling may be calibrated to balance between the system performance needs, and the frequency require to detect disturbed data before it becomes uncorrectable. Upon detection of a correctable error that has some number of bits in error above a pre-defined threshold, the read scrub copy is scheduled for the block.

Read scrub copy is a method by which data is read from the disturbed block and written to another block, after correction of all data which has correctable ECC error. The original block can then be returned to the common free block pool and eventually erased and written with other data. Read scrub scan and read scrub copy scheduling will be done in the NAND controller 300 in firmware by the processor 3040, such that the host controller 121 will not be aware of these housekeeping flash block level operations.

Embodiments Relating to Performing a Copy-Back Command

As described in the background section above, with a typical copy-back operation, a NAND flash memory device reads the data from a source address in its non-volatile memory into an internal register and then writes the data out of the register into a destination address in the non-volatile memory. Because the NAND flash memory device does not perform error correction code (ECC) operations on the data that it internally moves in a copy-back operation, any errors existing in the data would be propagated. In these embodiments, a controller interfacing between a host and one or more NAND flash memory devices is used to provide ECC functionality and other optimizations to overcome these issues. While any suitable architecture can be used, these embodiments will be described in conjunction with the architecture shown in FIG. 3. (It should be noted that the use of NAND interfaces and other details from FIG. 3 and the corresponding discussion should not be read into the claims unless explicitly recited therein.) In this embodiment, the control module 340 in FIG. 3 takes the form of circuitry operative to perform the acts shown in FIG. 14. As used herein, "circuitry" can take the form of one or more of a microprocessor or processor and a computer-readable medium that stores computer-readable program code (e.g., software or firmware) executable by the (micro)processor, logic gates, switches, an application specific integrated circuit (ASIC), a programmable logic controller, and an embedded microcontroller, for example, as discussed and illustrated above.

Figure 14:
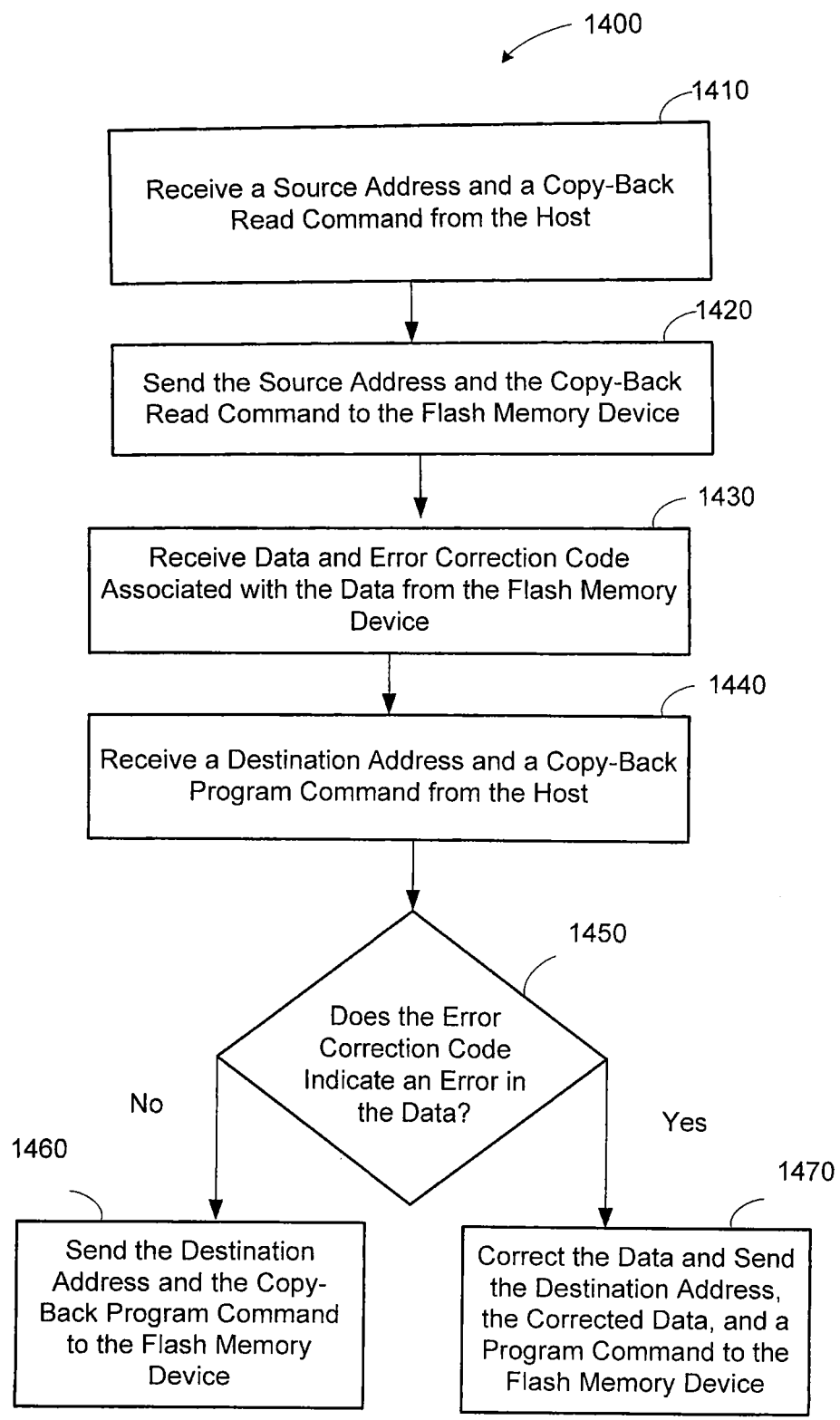
FIG. 14 is a flowchart of a method of an embodiment for performing a copy-back operation.

Turning now to the flowchart 1400 in FIG. 14, the controller 300 receives a source address and a copy-back read command from the host 320 (act 1410). The controller 300 then sends the source address and the copy-back read command to the flash memory device 330 (act 1420). In response to this command, the flash memory device 330 reads data from the source address in its non-volatile memory and writes the data in an internal register, which can be in the non-volatile memory or some other location in the flash memory device 330. (The terms "register," "cache," and "buffer" are used interchangeably herein.) Next, the controller 300 receives the data and error correction code associated with the data from the flash memory device 330 (act 1430) and receives a destination address and a copy-back program command from the host 320 (act 1440). The controller 300 then determines if the error correction code indicates there is an error in the data (act 1450). If the error correction code does not indicate there is an error in the data, the controller 300 sends the destination address and the copy-back program command to the flash memory device 330 (act 1460), in response to which the flash memory device 330 reads the data out of the register and writes the data to the destination address. However, if the error correction code indicates there is an error in the data, the controller 300 corrects the data (using the ECC correction techniques described above, for example) and sends the destination address, the corrected data, and a program command to the flash memory device 330 (act 1470).

There are several advantages associated with these embodiments. For example, unlike prior copy-back operations in which the NAND flash memory copied data without checking ECC (thus, propagating any errors), with these embodiments, the controller 300 checks and corrects errors, thereby improving the reliability of the data. Also, performance is optimized by allowing the NAND flash memory device to proceed with its normal copy-write operation if the controller 300 does not detect an error, as the controller 300 does not need to spend time or bandwidth sending the same data back over the NAND interface to the NAND flash memory device since the NAND flash memory device already has the data it needs.

In one embodiment, the above functionality is implemented using a command and address sequence similar to the copy-back function defined on pages 122-124 of the ONFI 2.0 specification. For example, with reference to FIG. 3 and specific ONFI commands, the host 320 would send a read command (x'00') followed by the source address and a x'35' copy-back read command to the controller 300 over the first interface 325. The controller 300 would send the same read command, source address, and x'35' copy-back read command over second interface 335 to flash memory device 330. This would cause the flash memory device 330 to read the data from its NAND array into a register on the NAND die and transfer the data over the second 335 into BRAM 3050 in the controller 300 (see FIG. 13A). The controller 300 could perform ECC correction as described above. Optionally, the data can also be transferred over the first interface 325 to the host 320.

After the read is completed, the host 320 would send a copy-back program command (x'85') followed by the destination address and a x'MM' command to the controller 300 over the first interface 325, where x'MM' is any unused command code. (Optionally, this operation sequence could have been signaled by a different copy-back program command (something besides x'35' and x'00' or the copy-back program command x'85'). The controller 300 can now take one of two actions depending on whether an ECC correction was made. If there was no ECC correction, the controller 300 would send a copy-back write command with the destination address and an x'10' command over the second interface 335 to the flash memory device 330, thereby avoiding the extra transfer time of sending the data back to the flash memory device. However, if there was a correctable ECC error, the controller 300 would issue a normal program command (along with corrected data) x'80' with the destination address and an x'10' command over the second interface 235 to the flash memory device 330. After either of these commands is complete, the controller 300 can signal completion to the host 320 via the first interface 325.

There are many alternatives that can be used with these embodiments. For example, in one alternative, the data is copied from one plane to another plane in the same flash memory die or logical unit (LUN). In this alternative, the source and destination addresses would be in different planes, with the host 320 selecting a different plane (e.g., a different interleaved address in ONFI). If the register is shared between the different planes, the method described above can be used. However, if there is not a shared register, it may be preferred to perform act 1470 even if the error correction code does not indicate an error in the data.

In another alternative, the data is copied from one die or LUN to another die or LUN. The method described above is generally used here, but, in this alternative, the host may issue a Read Status Enhanced command to the source LUN in order to uniquely identify where the data is coming from (if multiple copy-back reads can be processed in parallel by different source LUNs, the source for the copy-back write operation should be selected. Also, for the copy-back program command, the host 320 may select a destination die or LUN. Since the controller-stored contents of the previous copy-back read may be associated with the LUN or die, this may also include making both the source LUN or die and the destination LUN or die busy since both LUNs or dies may not be able to process other commands until this command sequence is completed. Also, as with the alternative mentioned above, if there is not a shared register between the LUNs or dies, it may be preferred to perform act 1470 even if the error correction code does not indicate an error in the data. In either of these alternatives, one or more new and unique command codes can also be used to further specify that these operations are across planes, LUNs, or dies. As yet another alternative, copy-back read and write can be performed on different planes and/or different LUNs (or dies) without ECC correction. The use of the controller 300 enables this operation, since in the ONFI 2.0 spec, a page register is dedicated to each plane.

In yet another alternative, in the situation where the copy occurs in the same plane and same die, the normal use of copy-back read and copy-back write can still be used to transfer data into and out of the internal register in the flash memory device without ECC correction. However, by specifying a unique (e.g., vendor reserved) field in a Set or Get feature command, the default behavior for the copy-back read/copy-back write can be set to automatically do the transfer from the flash memory device into the BRAM of the controller 300 to perform the ECC correction and other operations described above. In this way, flipping a bit can allow the controller 300 to optionally operate in either mode. For example, in one embodiment, a vendor-unique command can be added to ONFI or TM, which allows the host 320 to issue such a command as part of page management or wear leveling, for example. Other possibilities include adding an extra bit in the parameter page that specifies that is how the copy-back function always works, using a set feature command that can optionally enable or disable this mode, and defining a new second command byte that indicates that checking and correction should be performed (e.g., a second command byte of xNN instead of x35 in the ONFI copy-back function).

Another alternative embodiment relates to the use of ECC on modifications (e.g., changes or additions) to information (e.g., the header) of copy-back data. In some situations, data is changed during the copy-back operation. For example, pages 122-126 of the ONFI 2.0 specification discuss the ability of a host to change a portion of a page, such as the header field, by issuing a change read column command. However, it does not provide a way to do this with any error checking or correction, so any errors encountered in the header are ignored. Also, there are situations in the embodiments discussed in the previous paragraphs where the controller 300 (in addition to or instead of the host 320) may want to change header information or another part of the data. Consider, for example, if the controller 300 is used in a copy-back operation where data is being copied to different planes or dies (e.g., in a garbage collection/reclaim function where the source and destination of blocks and pages are not likely to be in the same die or plane). In such a situation, the controller 300 may generate header information for the block or page of data being copied. Examples of header information include, but are not limited to, the SATA LBA address (i.e., the logical address), the type field (e.g., data vs. control), the physical start address, the offset in a front end address block grouping (Fgroup), the run length of data (which may need to be modified if broken up into two smaller runs), and an endurance tag (i.e., an indication of need for wear-leveling or read Scrub).

Figure 15:
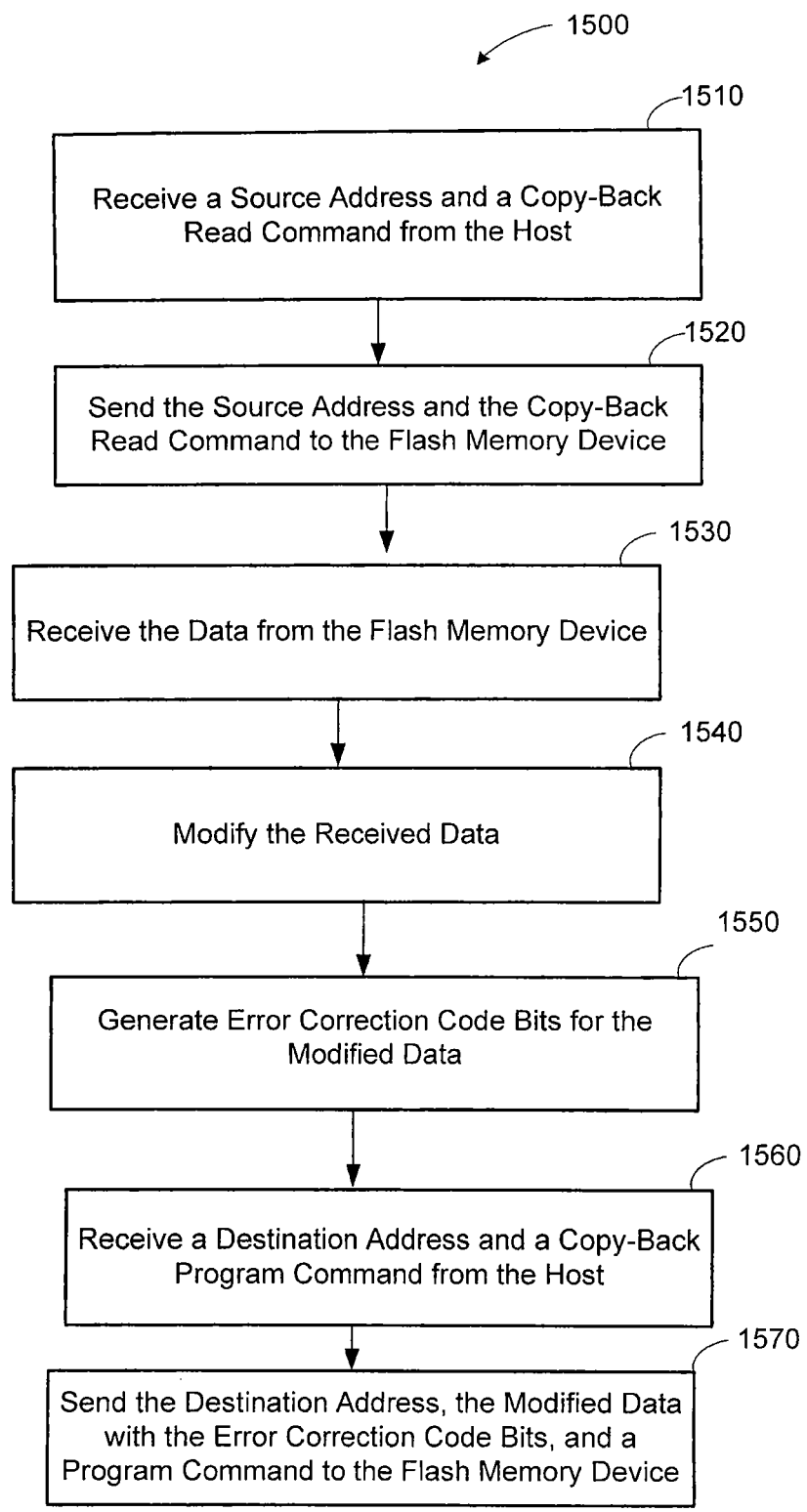
FIG. 15 is a flowchart of a method of an embodiment for performing a copy-back operation in which data is modified.

In this embodiment, the controller 300 generates ECC bits to cover the modified data in a copy-back operation. This embodiment will now be discussed with reference to the flowchart 1500 in FIG. 15. First, the controller 300 receives a source address and a copy-back read command from the host 320 (act 1510) and sends the source address and the copy-back read command to the flash memory device 330 (act 1520). The controller 300 then receives data from the flash memory device 320 (act 1530) and modifies the received data (act 1540). Next, the controller 330 generates error correction code bits for the modified data (act 1550). When the controller 330 receives a destination address and a copy-back program command from the host 320 (act 1560), it sends the destination address, the modified data with the error correction code bits, and a program command to the flash memory device 330 (act 1570).

In another embodiment, the control module 340 may generate some of the modified data (instead of it coming from the host controller 321) transparently to the host controller 321. The control module 340 would typically modify some of the header data if it was doing bad block management. For example, it may store the logical block address and endurance (or cycle count) data in the header field. When the control module 340 needs to relocate a block due to handling read scrubbing or recovery from a write error, for example, it may copy the block to a different physical block and need to update some of the values in the header field. The operation would proceed as described above, where the controller 300 reads from the flash memory device 320, modifies the data, and generates an error correction code for the modified data.

Accordingly, this embodiment enables copies between different planes, dies, and LUNs, as well as correcting ECC errors, optionally including or recreating revised header fields automatically by the controller 300 or by the host 320. As above, the functionality of this embodiment can be triggered in any suitable way, such as, but not limited to, via an extra bit in the parameter page that specifies that the copy-back function always works, via a set feature command that can optionally enable or disable this mode, or via a newly-defined second command byte that indicates checking and correction (e.g., a second command byte of the ONFI xNN command instead of the ONFI x35 command).

It should be noted that the source and/or destination addresses mentioned above can be physical addresses, or they can be logical addresses that are mapped to physical addresses by the controller 300. Also, the address can be an address range (e.g., the "from_sector" and "to_sector"), or the command can specify an amount of data (e.g., a number of sectors) to handle from the starting address. Alternatively, the amount of data to be handled from a given location can be imputed, so there would be no need to specify an amount of data to handle (e.g., in the case where the NAND flash memory device 330 operates on a single-sector or single-page basis).

Also, it should be noted that after a copy-back operation, the original data at the source address may or may not remain at the source address. That is, in these embodiments, "copy" can refer to what it typically thought of as a "copy" (e.g., the original data remains in the source address after the operation is complete. However, "copy" can also refer to what is typically thought of as a "move" (i.e., the original data remains in the source address after the copy-back operation). In one embodiment, the copy-back command itself specifies a disposition of the data at the source location. For example, the command can comprise a parameter (e.g., a flag in the command string) that specifies the disposition of the data at the source location. In another embodiment, the disposition of the data at the source location is implicit in the command's schematic. For example, a "COPY_SECTORS" command can be defined such that the semantics of the command itself implies that the original sectors of data are to remain undisturbed after the data is written to the destination location. Similarly, a "MOVE_SECTORS" command can be defined such that the semantics of the command itself implies that some action is to be taken (e.g., logically delete the data in the source sectors) after the data is written to the destination location.

As noted above, disposition of the data at the source location can take various forms. For example, one type of disposition is to leave the data at the source location as-is. This type of disposition is consistent with what is typically considered a "copy" operation, since the data at the source location is left intact. Another type of disposition is to physically erase (e.g., either as a simple, one-pass erase or as a multi-pass secure erase) the data at the source location (e.g., by overwriting the data at the source location with zeroes). This type of disposition is consistent with what is typically considered a "move" or "cut-and-paste" operation, since the data at the source location is removed. This type of disposition may be preferred in security environments, where it is desired to avoid leaving data "residue" behind. Yet another type of disposition is to logically delete the data at the source location, which is referred to as "trimming." With this type of disposition, the data at the source location is not physically erased, but an entry for the data in an allocation table or metadata for the file is marked as deleted, as invalid, or as unwritten. In this way, the trimmed sectors can be ignored in a garbage collection cycle, so they do not have to be moved. Since the data at the location is not physically erased, it can later be reclaimed, if desired. While either deleting or trimming can be used in certain types of memory devices, such as solid-state drives or other types of flash memory devices, trimming may not be an available option with memory devices that do not have an allocation table, such as hard disk drives. As yet another example of disposition types, a command can indicate a "don't care" condition for the data at the source location. Further information about additional variations that can be used in these embodiments can be found in U.S. patent application Ser. Nos. 12/338,378 and 12/544,529, which are hereby incorporated by reference.

CONCLUSION

It is intended that the foregoing detailed description be understood as an illustration of selected forms that the invention can take and not as a definition of the invention. It is only the following claims, including all equivalents that are intended to define the scope of this invention. Also, some of the following claims may state that a component is operative to perform a certain function or configured for a certain task. It should be noted that these are not restrictive limitations. It should also be noted that the acts recited in the claims can be performed in any order—not necessarily in the order in which they are recited.

What is claimed is:
1. A method for performing a copy-back command, the method comprising:
  performing in a controller in communication with a host and at least one flash memory device:
    receiving a source address and a copy-back read command from the host;
    sending the source address and the copy-back read command to the at least one flash memory device, wherein in response to receiving the source address and the copy-back read command, the at least one flash memory device reads data from the source address and writes the data in a register in the at least one flash memory device;
    receiving data stored at the source address and an error correction code associated with the data received from the at least one flash memory device;
    determining that the error correction code indicates there is no error in the data;
    modifying the received data, wherein the modification changes or adds information rather than corrects errors;

generating error correction code bits for modified data from the at least one flash memory device;

receiving a destination address and a copy-back program command from the host; and sending the destination address, the modified data with the error correction code bits, and a program command to the at least one flash memory device.

2. The method of claim 1, wherein the source address and destination address are for different planes of memory in one of the at least one flash memory device.

3. The method of claim 2, wherein the register in the at least one flash memory device is shared between the different planes.

4. The method of claim 1, wherein the source address and destination address are for different flash memory devices.

5. The method of claim 1, wherein the source and destination addresses are physical addresses.

6. The method of claim 1, wherein the source and destination addresses are logical addresses, and wherein the method further comprises using the controller to translate the logical addresses into physical addresses.

7. The method of claim 1, wherein the controller communicates with the host over a first interface and communicates with the at least one flash memory device over a second interface.

8. The method of claim 7, wherein at least one of the first and second interfaces comprises a NAND interface configured to transfer data using a NAND interface protocol.

9. The method of claim 1, wherein the data is modified by the controller.

10. The method of claim 1, wherein the data is modified by the host.

11. The method of claim 1, wherein the modification changes or adds information to a header of the data.

12. The method of claim 11, wherein the modification changes or adds information to one or more of the following in the header: a logical block address, a type field, a physical start address, a front end address block grouping, a run length of the data, and an endurance tag.

13. A method for performing a copy-back command, the method comprising:

performing in a controller in communication with a host and at least one flash memory device:

receiving a source address and a copy-back read command from the host;

sending the source address and the copy-back read command to the at least one flash memory device;

generating error correction code bits for modified data from the at least one flash memory device;

receiving a destination address and a copy-back program command from the host; and sending the destination address, the modified data with the error correction code bits, and a program command to the at least one flash memory device;

wherein the source address and destination address are for different planes of memory in one of the at least one flash memory device; and wherein the register in the at least one flash memory device is not shared between the different planes.

14. A controller comprising:

a first interface configured to transfer data between a host and the controller;

a second interface configured to transfer data between the controller and at least one flash memory device; and circuitry operative to:

receive a source address and a copy-back read command from the host;

send the source address and the copy-back read command to the at least one flash memory device, wherein in response to receiving the source address and the copy-back read command, the at least one flash memory device reads data from the source address and writes the data in a register in the at least one flash memory device;

receive data stored at the source address and an error correction code associated with the data received from the at least one flash memory device;

determine that the error correction code indicates there is no error in the data;

modify the received data, wherein the modification changes or adds information rather than corrects errors;

generate error correction code bits for modified data from the at least one flash memory device;

receive a destination address and a copy-back program command from the host; and send the destination address, the modified data with the error correction code bits, and a program command to the at least one flash memory device.

15. The controller of claim 14, wherein the source address and destination address are for different planes of memory in one of the at least one flash memory device.

16. The controller of claim 15, wherein the register in the at least one flash memory device is shared between the different planes.

17. The controller of claim 14, wherein the source address and destination address are for different flash memory devices.

18. The controller of claim 14, wherein the source and destination addresses are physical addresses.

19. The controller of claim 14, wherein the source and destination addresses are logical addresses, and wherein the circuitry is further operative to use the controller to translate the logical addresses into physical addresses.

20. The controller of claim 14, wherein at least one of the first and second interfaces comprises a NAND interface configured to transfer data using a NAND interface protocol.

21. The controller of claim 14, wherein the data is modified by the controller.

22. The controller of claim 14, wherein the data is modified by the host.

23. The controller of claim 14, wherein the modification changes or adds information to a header of the data.

24. The controller of claim 23, wherein the modification changes or adds information to one or more of the following in the header: a logical block address, a type field, a physical start address, a front end address block grouping, a run length of the data, and an endurance tag.

25. A controller comprising:

a first interface configured to transfer data between a host and the controller;

a second interface configured to transfer data between the controller and at least one flash memory device; and circuitry operative to:

receive a source address and a copy-back read command from the host;

send the source address and the copy-back read command to the at least one flash memory device, wherein in response to receiving the source address and the copy-back read command, the at least one flash memory device reads data from the source address and writes the data in a register in the at least one flash memory device;

generate error correction code bits for modified data from the at least one flash memory device;

receive a destination address and a copy-back program command from the host; and send the destination address, the modified data with the error correction code bits, and a program command to the at least one flash memory device;

wherein the source address and destination address are for different planes of memory in one of the at least one flash memory device; and wherein the register in the at least one flash memory device is not shared between the different planes.

\* \* \* \* \*